US009460800B2

(12) United States Patent
Lee et al.

(10) Patent No.: US 9,460,800 B2
(45) Date of Patent: Oct. 4, 2016

(54) NONVOLATILE MEMORY SYSTEM AND REFRESH METHOD

(71) Applicant: SAMSUNG ELECTRONICS CO., LTD., Suwon-Si, Gyeonggi-Do (KR)

(72) Inventors: Change-Hee Lee, Hwaseong-Si (KR); Jang-Hwan Kim, Suwon-Si (KR); Jung-Been Im, Anyang-Si (KR); Dong-Hyun Song, Hwaseong-Si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/095,183

(22) Filed: Apr. 11, 2016

(65) Prior Publication Data

US 2016/0225455 A1    Aug. 4, 2016

Related U.S. Application Data

(60) Division of application No. 14/176,303, filed on Feb. 10, 2014, now Pat. No. 9,336,889, which is a continuation of application No. 13/175,973, filed on Jul. 5, 2011, now Pat. No. 8,675,406.

(30) Foreign Application Priority Data

Jul. 9, 2010    (KR) .................. 10-2010-0066538

(51) Int. Cl.
*G11C 16/04*    (2006.01)
*G11C 16/16*    (2006.01)

(52) U.S. Cl.
CPC .............. *G11C 16/16* (2013.01); *G11C 16/04* (2013.01)

(58) Field of Classification Search
CPC ...................................... G11C 16/04
USPC .............. 365/185.01–185.33, 189.011–225.5
See application file for complete search history.

(56) References Cited

U.S. PATENT DOCUMENTS

| | | | |
|---|---|---|---|
| 5,835,413 A | 11/1998 | Hurter et al. | |
| 6,088,268 A | 7/2000 | Gupta et al. | |
| 6,950,363 B2* | 9/2005 | Matsubara | 365/222 |
| 7,342,825 B2* | 3/2008 | Takeuchi et al. | 365/185.03 |
| 2004/0257888 A1* | 12/2004 | Noguchi et al. | 365/200 |
| 2006/0268608 A1* | 11/2006 | Noguchi et al. | 365/185.09 |
| 2007/0058433 A1* | 3/2007 | Takeuchi et al. | 365/185.17 |
| 2007/0070764 A1* | 3/2007 | Miyamoto et al. | 365/222 |
| 2007/0223280 A1* | 9/2007 | Takeuchi et al. | 365/185.18 |
| 2008/0055997 A1* | 3/2008 | Lee | 365/185.18 |
| 2008/0068912 A1* | 3/2008 | Lee | 365/222 |
| 2008/0239808 A1* | 10/2008 | Lin | 365/185.09 |
| 2008/0266965 A1* | 10/2008 | Takeuchi et al. | 365/185.17 |
| 2009/0161466 A1 | 6/2009 | Hamilton et al. | |
| 2009/0316499 A1* | 12/2009 | Hidaka | 365/189.011 |
| 2009/0323416 A1* | 12/2009 | Takeuchi et al. | 365/185.03 |
| 2010/0182863 A1* | 7/2010 | Fukiage | 365/222 |
| 2010/0322024 A1* | 12/2010 | Yagishita | 365/200 |

FOREIGN PATENT DOCUMENTS

KR    1020040052409 A    6/2004

OTHER PUBLICATIONS

U.S. Appl. No. 15/095,183.*

\* cited by examiner

*Primary Examiner* — Harry W Byrne
(74) *Attorney, Agent, or Firm* — Volentine & Whitt, PLLC

(57) ABSTRACT

A memory system including non-volatile memory devices and a corresponding refresh method are disclosed. The method groups memory blocks of the non-volatile memory devices into memory groups, determines a refresh sequence for the memory groups, and refreshes the memory groups in accordance with the refresh sequence.

13 Claims, 26 Drawing Sheets

Fig. 10

| MG | BLK | NVM |
|---|---|---|
| MG 1 | BLK_1 | NVM 1 |
| | BLK_k+1 | |
| MG 2 | BLK_2 | |
| | BLK_k+2 | |
| MG 3 | BLK_1 | NVM 2 |
| | BLK_k+1 | |
| MG 4 | BLK_2 | |
| | BLK_k+2 | |

Fig. 13

| MG | BLK | NVM |
|---|---|---|
| MG 1 | BLK_1 | NVM 1 |
| | | NVM 2 |
| MG 2 | BLK_2 | NVM 1 |
| | | NVM 2 |
| MG 3 | BLK_k+1 | NVM 1 |
| | | NVM 2 |
| MG 4 | BLK_k+2 | NVM 1 |
| | | NVM 2 |

Fig. 17

| MG | BLK | NVM |
|---|---|---|
| MG 1 | BLK_1 | NVM 11 |
| | BLK_k+1 | |
| MG 2 | BLK_2 | |
| | BLK_k+2 | |
| MG 3 | BLK_1 | NVM 12 |
| | BLK_k+1 | |
| MG 4 | BLK_2 | |
| | BLK_k+2 | |
| MG 5 | BLK_1 | NVM 21 |
| | BLK_k+1 | |
| MG 6 | BLK_2 | |
| | BLK_k+2 | |
| MG 7 | BLK_1 | NVM 22 |
| | BLK_k+1 | |
| MG 8 | BLK_2 | |
| | BLK_k+2 | |

Fig. 20

| MG | BLK | NVM |
|---|---|---|
| MG 1 | BLK_1 | NVM 11 |
| | | NVM 12 |
| | | NVM 21 |
| | | NVM 22 |
| MG 2 | BLK_2 | NVM 11 |
| | | NVM 12 |
| | | NVM 21 |
| | | NVM 22 |
| MG 3 | BLK_k+1 | NVM 11 |
| | | NVM 12 |
| | | NVM 21 |
| | | NVM 22 |
| MG 4 | BLK_k+2 | NVM 11 |
| | | NVM 12 |
| | | NVM 21 |
| | | NVM 22 |

US 9,460,800 B2

NONVOLATILE MEMORY SYSTEM AND REFRESH METHOD

CROSS-REFERENCE TO RELATED APPLICATIONS

This is a Divisional of U.S. application Ser. No. 14/176,303, filed Feb. 10, 2014, which claims priority to U.S. patent application Ser. No. 13/175,973, filed Jul. 5, 2011, now U.S. Pat. No. 8,675,406 B2, issued Mar. 18, 2014, which claims priority under 35 U.S.C §119 to Korean Patent Application No. 10-2010-0066538 filed Jul. 9, 2010, the subject matter of which is hereby incorporated by reference.

BACKGROUND OF THE INVENTION

The present inventive concept is related to memory systems, and more particularly, to memory systems performing refresh operations. The present inventive concept is related to methods of performing refresh operations in a memory system.

Portable electronic devices have become an important part of modern lifestyles. Digital cameras, MP3 players, cellular phones, PDAs, and the like are commonly used by many across a broad spectrum of personal and professional applications. Contemporary portable electronic devices include ever more sophisticated memory systems. Such memory systems may be configured around one or more types of memory cells. Memory cells may be generally classified as being volatile in their operating nature (e.g., DRAM and SRAM), or non-volatile (e.g., EEPROM, FRAM, PRAM, MRAM, and flash memory). Volatile memories lose stored data in the absence of applied power, while non-volatile memories are able to retain stored data even in the absence of applied power.

Stored data integrity is an important aspect of ensuring overall memory system reliability. That is, the value of constituent stored data must not unintentionally or unpredictably change over time within a memory system. However, maintaining data integrity is a significant challenge. Many environmental and operational factors common to conventional memory systems tend to change the state of stored data.

SUMMARY OF THE INVENTION

In one aspect, the inventive concept provides a memory system comprising; at least one non-volatile memory device including memory blocks, and a memory controller controlling the at least one non-volatile memory devices, wherein the memory controller is configured to group memory blocks into a plurality of memory groups, define a refresh sequence for the plurality of memory groups, and execute a refresh operation for the plurality memory groups in accordance with the refresh sequence.

In another aspect, the inventive concept provides a memory system comprising; a non-volatile memory device including memory blocks, and a memory controller controlling the non-volatile memory device. The memory controller comprises; a refresh manage module that groups the memory blocks into memory groups and determines a refresh sequence for the memory groups, and a refresh register that stores information associated with the refresh sequence, and the memory controller refreshes the memory groups according to a refresh operation executed in accordance with the refresh sequence.

In yet another aspect, the inventive concept provides a refresh method of a memory system including non-volatile memory devices. The method comprises grouping memory blocks of the non-volatile memory devices into memory groups, determining a refresh sequence for the memory groups, and refreshing the memory groups in accordance with the refresh sequence.

BRIEF DESCRIPTION OF THE DRAWINGS

The above and other objects and features will become apparent from the following description with reference to the following figures, wherein like reference numerals refer to like parts throughout the various figures unless otherwise specified, and wherein

FIGS. 9, 10 and 11 are diagrams conceptually illustrating a refresh operation for the memory system of FIG. 8 according to another embodiment of the inventive concept.

FIGS. 12, 13 and 14 are diagrams conceptually illustrating a refresh operation for the memory system of FIG. 8 according to a yet another embodiment of the inventive concept.

FIGS. 16, 17 and 18 are diagrams conceptually illustrating a refresh operation for the memory system of FIG. 15 according to another embodiment of the inventive concept.

FIGS. 19, 20 and 21 are diagrams conceptually illustrating a refresh operation for the memory system of FIG. 15 according to a yet another embodiment of the inventive concept.

DETAILED DESCRIPTION

Figure 1:
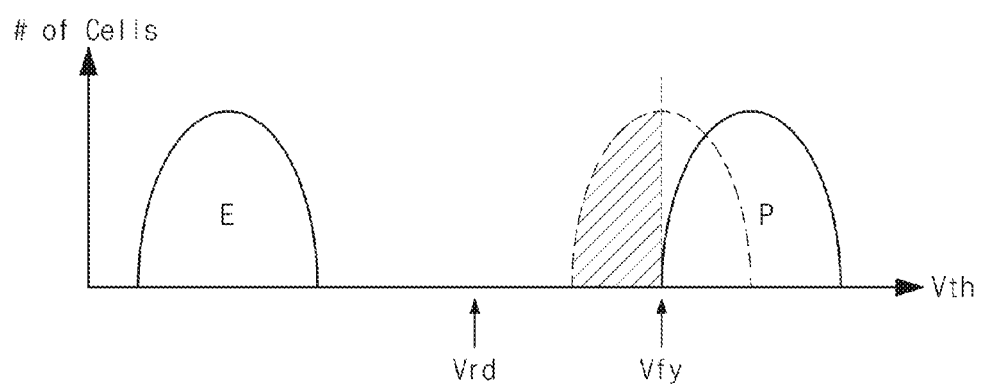
FIG. 1 is a diagram showing data retention characteristic of a conventional non-volatile memory device.

Certain embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the drawings and written description, like reference numbers and labels are used to denote like or similar elements.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram illustrating a data retention characteristic of a conventional non-volatile memory device. As noted above, data retention (or data integrity maintenance) is an important characteristic of a non-volatile memory device and strongly influences the overall reliability of the memory device. And data integrity must be secured against many environmental and operational factors that tend to change (or disturb) stored data values.

For example, in a case assuming the use of flash memory cells having respective floating gates, electrons on the floating gate may leak away over time. The loss of these electrons from the floating gate causes a decrease in the threshold voltage of the constituent flash memory cell. In a case assuming the use of phase change memory cells having a chalcogenide material, a Joule heating effect may be generated during the programming of a target memory cell. One or more memory "adjacent" cells proximate to the target memory cell may be inadvertently programmed by the Joule heating effect. As a result, the resistance of the adjacent memory cell may be unintentionally altered causing a change in the threshold voltage of the phased change memory cell.

Regardless of the stored data disturbing mechanism at issue, the effect on data stored in a non-volatile memory cells may be further understood by consideration of FIG. 1. The dotted line shown in FIG. 1 indicates a "changed" threshold voltage for a memory cell that has been unintentionally shifted to a lower voltage. Given the inherent variability in the performance of individual memory cells, and the narrowness of read margins in contemporary non-volatile memory systems, it is quite possible that a changed threshold voltage may result in an erroneous stored data determination. At a minimum, changed threshold voltages for non-volatile memory cells result in reduced read margin, increased read errors, and lower memory system reliability.

In order to overcome the above-described problems, memory systems according to certain embodiments of the inventive concept provide a refresh operation that is applied to defined memory groups. This approach better secures the integrity of stored data within constituent memory systems.

Further, certain memory systems according to embodiments of the inventive concept refresh memory groups according to a particular sequence or order. Use of a particular refresh sequence reduces the overhead associated with operating a memory system incorporating a refresh operation. Memory systems and related refresh operations according to embodiments of the inventive concept will be described in some additional detail hereafter.

Figure 2:
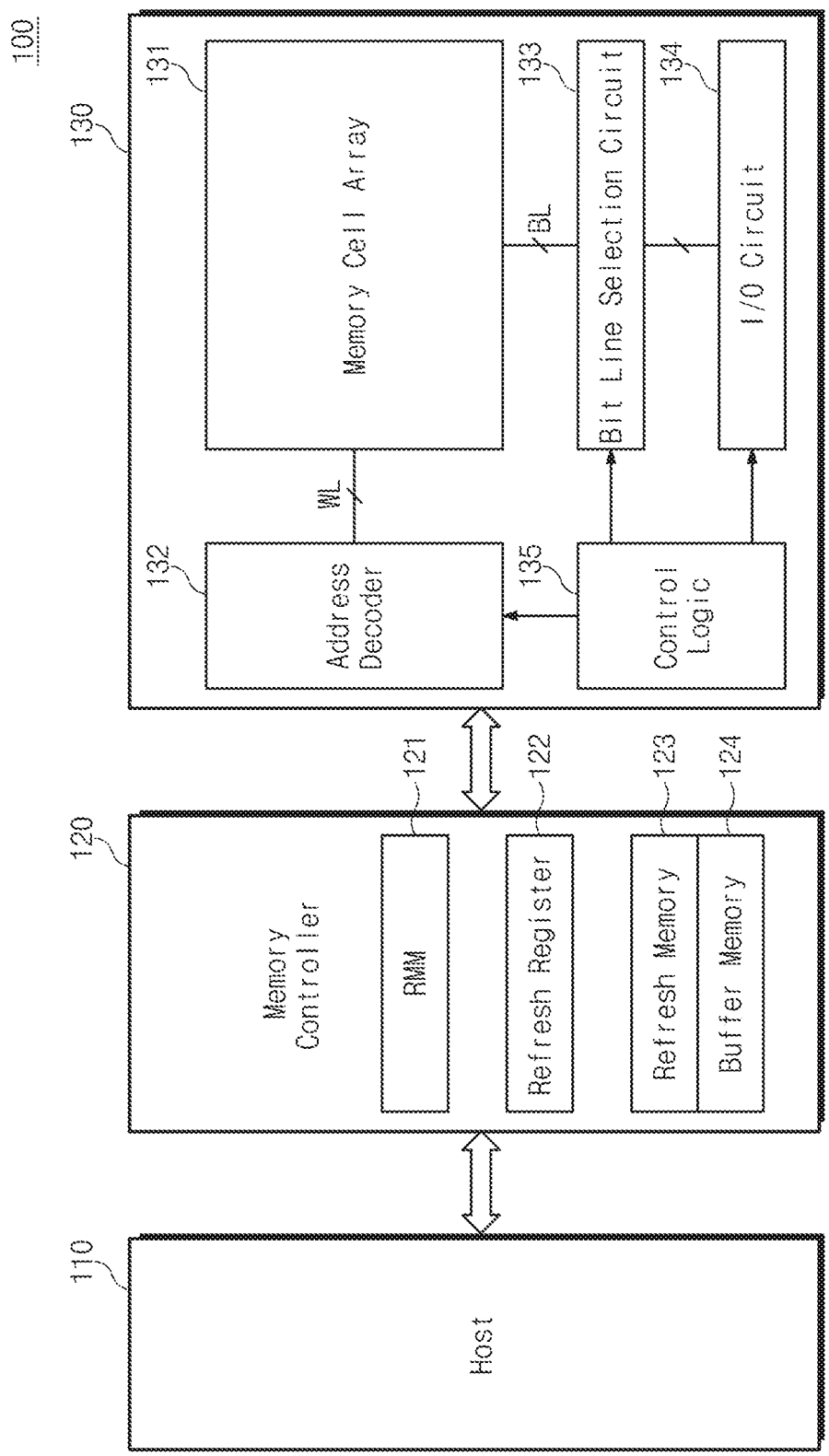
FIG. 2 is a block diagram illustrating a memory system according to an embodiment of the inventive concept.

FIG. 2 is a block diagram illustrating a memory system according to an embodiment of the inventive concept. Referring to FIG. 2, a memory system 100 generally comprises a memory controller 120 and a non-volatile memory device 130.

In FIG. 2, the memory system 100 is shown connected to a host 110. It is assumed for purposes of description that the host 110 controls memory system operations (e.g., read, program, and erase operations) that are necessary to receive data and store data from host 110 and retrieve and provide data to the host 110.

The memory controller 120 is connected between the host 110 and the non-volatile memory device 130, and comprises a Refresh Manage Module (RMM) 121, a refresh register 122, a refresh memory 123, and a buffer memory 124. The memory controller 120 controls execution of a defined refresh operation within the non-volatile memory 130.

The RMM 121 executes a grouping operation (i.e., a "grouping") for memory blocks defined within the memory cell array 131. The resulting definition of memory blocks by the grouping operation will be referred to as a "memory group" or MG. Thus, the term memory group or MG refers to a set of memory blocks which are refreshed by one refresh operation. For example, the RMM 121 may configure memory blocks of the memory cell array 131 into two or more memory groups. A memory group may include only a single memory block, or it may include two or more memory blocks. The actual number of memory blocks included in each memory group and the corresponding manner of grouping may be variously defined according to a refresh policy for a particular memory system in view of factors such as operating environment and application.

Additionally, the RMM 121 determines a refresh sequence for the defined memory groups. Memory groups may be refreshed according to any reasonably indicated order. Some refresh sequences may be sequential in nature relative to a physical arrangement of the memory groups (or constituent memory blocks), or a logical arrangement of the memory groups. Other refresh sequences may be random or pseudo-random in nature relative to a physical arrangement of the memory groups (or constituent memory blocks), or a logical arrangement of the memory groups.

The refresh register 122 stores address information for memory groups and memory blocks within each memory group. The refresh register 122 also stores information associated with a refresh sequence as determined by the RMM 121. The refresh register 122 may also store address information identifying a last refreshed memory group. The term "last refreshed memory group" refers to a most recently refreshed memory group among a set of previously refreshed memory groups.

When a refresh operation is to be executed, the memory controller 120 checks the refresh register 122 to determine a "next refreshed memory group". That is, in view of a defined refresh sequence, the memory controller 120 may check the information stored in the refresh register 122 (e.g., memory group address information) to identify which memory group should next be refreshed. Once the next refreshed memory group has been identified, the refresh operation may be performed. A memory group currently being refreshed by a refresh operation will be referred to as a "target memory group".

The refresh memory 123 may be used to temporarily store data from a target memory group. For example, when a refresh operation is executed, data from a target memory group may be copied to the refresh memory 123 from the memory cell array 131. After the target memory group is erased, data stored in the refresh memory 123 may be copied-back (i.e., reprogrammed) to the appropriate locations in the memory cell array 131.

The buffer memory 124 may be used to store "write data" transferred from the host 110 and to-be-stored in the memory cell array 131. Thus, write data temporarily stored in the buffer memory 124 may be programmed to the memory cell array 131 during one or more subsequently executed write operation(s). Further, the buffer memory 124 may also be used to store "read data" transferred from the non-volatile memory device 130 to the host device 110 during one or more read operation(s). In this manner, the buffer memory 124 may be used to facilitate exchanges of write data and read between the host 110 and the memory system 100.

The non-volatile memory device 130 may be connected to the memory controller 120 using any number of conventionally understood connection schemes and/or data exchange protocols. The non-volatile memory device 130 generally comprises a memory cell array 131, an address decoder 132, a bit line selection circuit 133, an input/output circuit 134, and control logic 135.

In the illustrated embodiment of FIG. 2, the memory cell array 131 is assumed to include a plurality of conventionally provided memory blocks that have been divided into memory groups by the RMM 121. A somewhat more detailed description of the memory cell array 131 will be given in relation to FIG. 3.

The address decoder 132 is connected to the memory cell array 131 via word lines WL. The address decoder 132 receives row and column addresses from the memory controller 120. The address decoder 132 decodes the row address to select word lines WL of the memory cell array 131. The address decoder 132 decodes the column address to control the bit line selection circuit 133

The bit line selection circuit 133 is connected to the memory cell array 131 via bit lines BL. The bit line selection circuit 133 may select bit lines in response to the control of the address decoder 132. When a refresh operation is executed, the bit line selection circuit 133 selects bit lines associated with the target memory group.

The input/output circuit 134 is connected to the bit line selection circuit 133. During a refresh operation, data stored in the target memory group is copied to the refresh memory 123 via the bit line selection circuit 133 and the input/output circuit 134. After the target memory group has been erased, data stored in the refresh memory 123 is copied-back (i.e., reprogrammed) to the memory cell array 131 via the input/output circuit 134 and the bit line selection circuit 133. The control logic 135 controls the overall operation of the non-volatile memory device 130.

Figure 3:
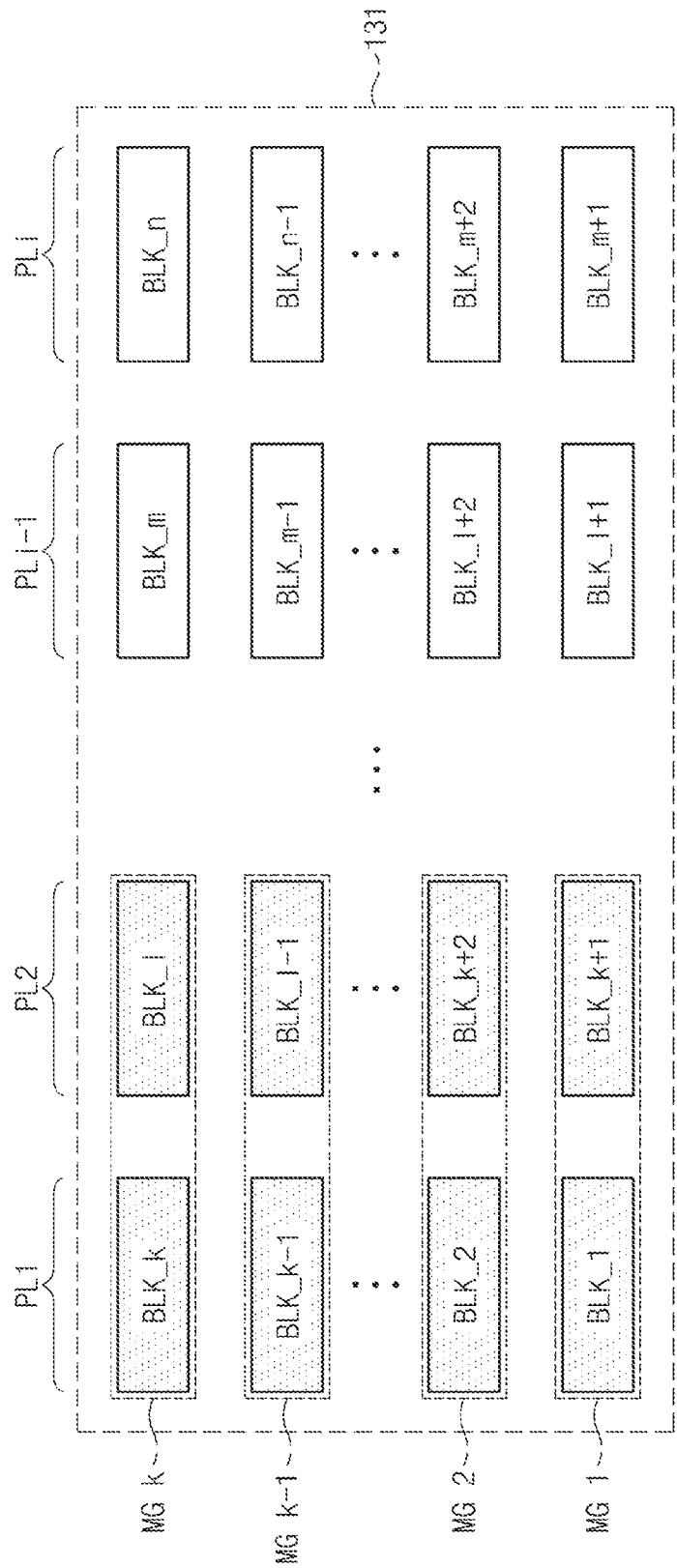
FIG. 3 is a block diagram further illustrating the memory cell array of FIG. 2.

FIG. 3 is a block diagram further illustrating the memory cell array 131 of FIG. 2 in one possible arrangement of memory blocks.

For ease of description, in FIG. 3, it is assumed that data has previously been programmed to memory blocks BLK_1 to BLK_k (the shaded blocks in FIG. 3) arranged in a first plane PL1, as well as memory blocks BLKK_k+1 to BLK_1 arranged in the second plane PL2.

Referring to FIGS. 2 and 3, the memory blocks of memory cell array 131 include a great plurality of memory cells, each respectively capable of storing data. Each memory cell may be able to store a single bit of data, or multiple bits of data. A memory cell storing 1-bit data is referred to as a Single Level Cell (SLC), and a memory cell storing 2 or more bits of data is referred to as a Multi Level Cell (MLC). Within certain embodiments of the inventive concept, SLCs and/or MLCs may be used. Flash memory cells (either SLC or MLC) having respective floating gates may be used. Phase change memory cells having a variable resistance material changed by the controlled application of temperature may be used. Magnetic random access memory cells or other types of phase change memory cells may be used.

Returning to FIG. 3, it is assumed that various memory blocks have been "grouped" by the RMM 121. For example, two memory blocks arranged along a common row or word line (i.e., two row-wise memory blocks) may be grouped as a memory group. Thus, blocks BLK_1 and BLK_k+1 constitute a first memory group MG_1. Blocks BLK_2 and BLK_k+2 constitute a second memory group MG_2, and so on, until blocks BLK_k and BLK_1 constitute a kth memory group MG_k.

Those skilled in the art will recognize that the exemplary grouping described above is merely one example, and any reasonable number of memory blocks may be grouped into a defined memory group using any coherent grouping constraints as dictated by an established refresh policy. For example, the memory blocks may be grouped in the columnar (or bit line) direction. Alternatively, three or more memory blocks may be grouped into a memory group, or each memory block may be defined as a memory group. As noted above, the controlling refresh policy may be established in view of many considerations (e.g., intended environment, application, power consumption requirements, operating criteria, such as unit erase, program and/or read sizes).

Figure 4:
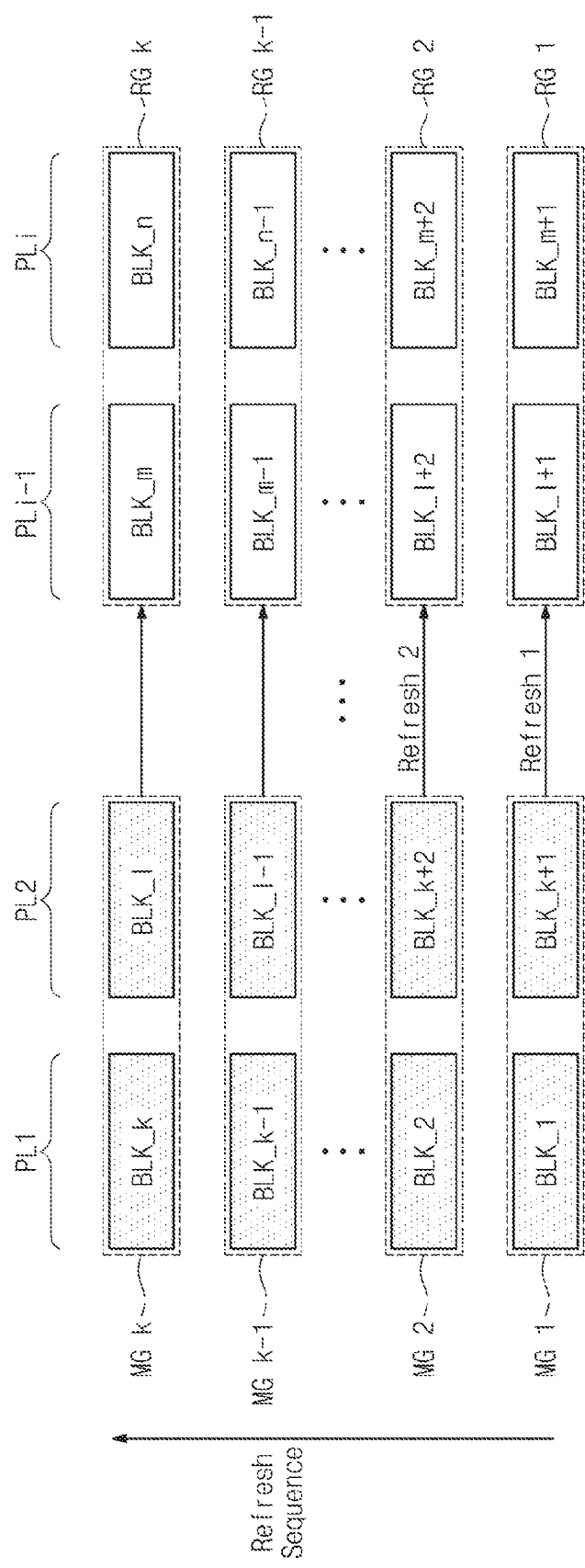
FIG. 4 is a diagram conceptually illustrating a refresh operation for the memory system of FIG. 2 according to an embodiment of the inventive concept.

FIG. 4 is a conceptual diagram describing one possible refresh operation for the memory system of FIG. 2 according to an embodiment of the inventive concept. It is assumed that memory blocks BLK_1 to BLK_k in the first plane PL1 and memory blocks BLK_k+1 to BLK_1 in the second plane PL2 have been previously programmed. Further, it is assumed that the memory blocks shown in FIG. 4 have been arranged in memory groups in a same manner similar to that described in relation to FIG. 3.

Referring to FIGS. 2 and 4, blocks BLK_1 and BLK_k+1 are arranged in the first memory group MG 1 by the refresh manage module 121 Blocks BLK_2 and BLK_k+2 are arranged in the second memory group MG 2, and so on until blocks BLK_k and BLK_1 are arranged in the kth memory group MG k. Address information for memory groups and constituent memory blocks within each memory group is stored in the refresh register 122.

A refresh sequence for memory groups MG 1 through MG k is determined by the refresh manage module 121. For example, it is assumed in the illustrated example of FIG. 4 that memory groups MG 1 through MG k are refreshed in a sequence from lowest memory group to highest memory group, where "low" and "high" are defined in relation to an arrangement of word lines within the memory cell array 131. Those skilled in the art will recognize that the terms "low" and "high" as used in this context denote arbitrary ordering relationships.

In the approach illustrated in FIG. 4, the refresh operation begins with the first memory group MG 1. Data stored in the first memory group MG 1 is copied (or loaded) into the refresh memory 123 using the bit line selection circuit 133 and the input/output circuit 134. Thus, an erase operation is executed with respect to the memory blocks of the first memory group MG 1. Following the erase operation, the data stored in the refresh memory 123 may be copied-back (i.e., reprogrammed) to the first memory group MG 1, or alternatively, the data may be copied to a designated first refresh group RG 1 (e.g., BLK_1+1 and BLK_M+1).

After the data has been copied (or copied-back) to an appropriate location in the memory cell array 131, updated address information indicating the results of the refresh operation applied to the first memory group MG 1 may be stored in the refresh register 122.

Under conditions where the refresh operation continues after refreshing the first memory group MG 1, the first memory group MG 1 is now identified as the last refreshed memory group by refresh information, stored for example in the refresh register 122. This refresh information may be queried by the memory controller 120 to determine the proper next refreshed memory group according to the established refresh sequence. In the case illustrated in FIG. 4, following refresh of the first memory group MG 1, the memory controller 120 will determine that the second memory group MG 2 is the next refreshed memory group. Accordingly, the refresh operation continues as described above in relation to the second memory group MG 2. In this manner, the refresh operation may continue until all memory groups designated by the refresh operation have been refreshed.

As is conventionally understood, new data blocks may be generated (e.g., reallocated) within the memory cell array 131 using various combinations of program, erase and/or merge operations. Where new data blocks are so generated, the refresh manage module 121 may generate grouping of new data blocks to define new memory groups. As the refresh manage module 121 defines new memory groups, the corresponding address information is stored in the refresh register 122 indicating the new memory groups and memory blocks within each of the new memory groups.

Additionally, the refresh manage module 121 will include new memory blocks, once defined, within one or more refresh sequence(s). Data defining the updated refresh sequence including the new memory group(s) may be stored in the refresh register 122.

As described above, the memory system 100 in FIG. 2 may be configured to arrange memory blocks in memory groups, and the memory groups may be further arranged in a refresh sequence. Using these features, it is possible to better secure the integrity of stored data within the memory system 100 by refreshing memory groups according to a defined sequence. This approach allows a straight-forward implementation of the memory system and tends to reduce the memory system management overhead.

The conceptual diagram of FIG. 4 emphasizes one possible embodiment of the inventive concept wherein a refresh group RG is used to store data copied from a target memory group during the refresh operation. That is, data from a target memory group is copied to memory blocks different from the memory blocks of the target memory group. This approach may be used to good advantage where non-volatile memory cell wear leveling is implicated in the transfer of target memory group data to less well-used memory block of a the refresh group.

Figure 5:
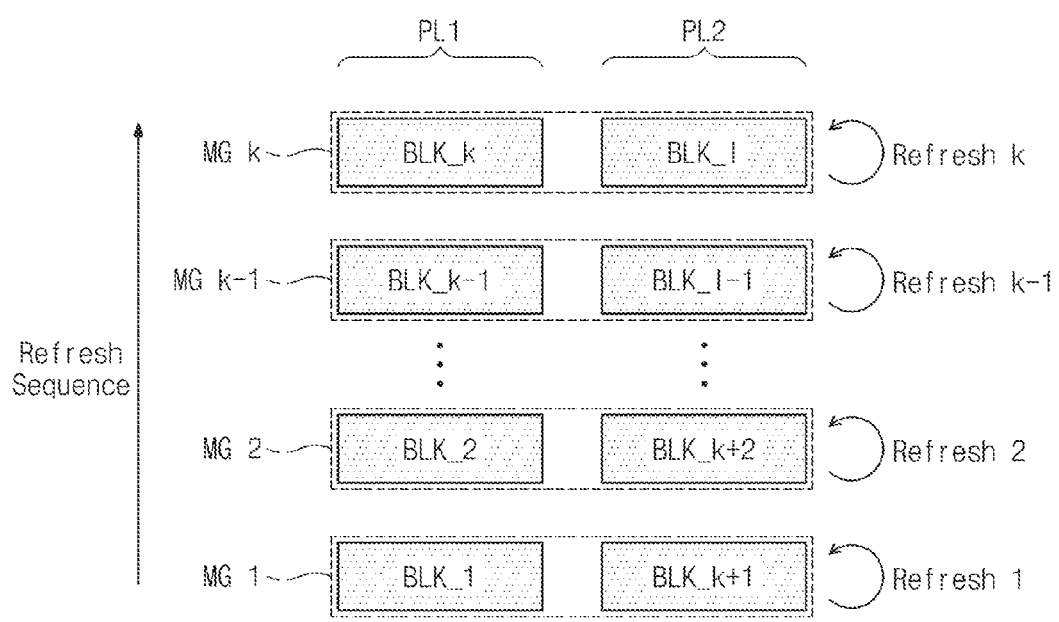
FIG. 5 is a diagram conceptually illustrating a refresh operation for the memory system of FIG. 2 according to another embodiment of the inventive concept.

FIG. 5 is a conceptual diagram describing a refresh operation for the memory system of FIG. 2 according to another embodiment of the inventive concept. The particular refresh operation described in relation to FIG. 5 is similar to the refresh operation described in relation to FIG. 4, but relevant differences will be noted below.

As before, it is assumed that memory groups MG 1 through MG k are refreshed according to ascending order sequence. However, unlike the example described in relation to FIG. 4, data stored in respective memory groups MG 1 through MG k is copied-back to the same memory group. No independent refresh group RG is used.

Thus, when a refresh operation is direct to the first memory group MG 1, data stored in the first memory group MG 1 is copied to the refresh memory 123 using the bit line selection circuit 133 and the input/output circuit 134. Then, an erase operation is performed on the memory blocks within the first memory group MG 1. Following the erase operation, data stored in the refresh memory 123 is re-copied to the first memory group MG 1 again using the input/output circuit 134 and the bit line selection circuit 133. Other memory groups designated by the refresh operation are similarly refreshed.

As described in relation to FIGS. 4 and 5, data copied from a target memory group may be programmed to the same memory blocks or different memory blocks. A decision between these two approaches may be made in view of memory system application, memory cell wear-leveling considerations, etc.

It should be noted at this point that the memory blocks indicated in FIGS. 3, 4 and 5 can include valid data and/or invalid data. In order to speed up execution of the refresh operation, memory systems according to embodiments of the inventive concept may be configured to perform refresh operations with respect to only valid data. This modification will be more fully described with reference to FIG. 6.

Figure 6:
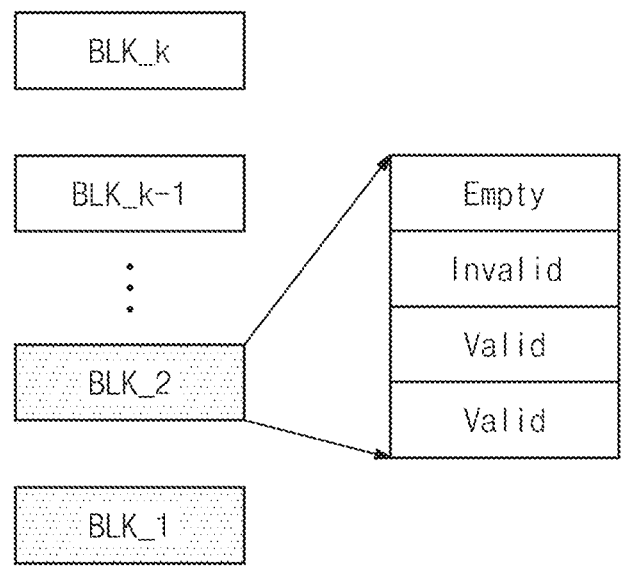
FIG. 6 is a diagram showing one possible configuration for the memory blocks of FIGS. 3, 4 and 5.

FIG. 6 is a conceptual diagram illustrating an exemplary configuration for the memory blocks of FIGS. 3, 4 and 5. In this exemplary embodiment, only the second memory block BLK_2 is considered in detail as an example of all other memory blocks. For ease of description, it is assumed that the second memory block BLK_2 includes only four (4) pages.

Referring to FIG. 6, a memory block BLK_2 is assumed to include two (2) valid pages, an invalid page, and an empty page. The term "valid page" denotes a page that has been properly programmed with valid data, and the term "invalid page" denotes a page that has not been properly programmed or currently stores invalid data. The term "empty page" denotes a page that has not yet been programmed.

It is assumed that a refresh operation is requested with respect to a memory group including a memory block BLK_2. Accordingly, during the refresh operation, data stored in the second memory block BLK_2 is copied to the refresh memory 123. Here, however, it is possible to copy only valid data from a designated valid page from among the pages in the second memory block BLK_2. For example, assuming that the memory system 100 is a flash memory device, the memory controller 120 may identify valid pages of data using a conventionally understood mapping table, perhaps associated with a constituent flash translation layer (FTL).

After valid pages have been copied to the refresh memory 123, an erase operation may be performed with respect to the entirety of the second memory block BLK_2. Afterwards, only the copied valid pages stored in the refresh memory 123 will be copied-back to the memory cell array 131 using one of the approaches described in relation to FIGS. 4 and 5.

Thus, as described in relation to FIG. 6, a memory system according to embodiments of the inventive concept may perform a refresh operation with respect to only valid data stored in a target memory group (or more particularly memory block within the target memory group). Valid data is indicated above with respect to individual pages of the memory blocks, but other valid/invalid data designations may be used. By copying and re-copying only valid data it is possible to execute refresh operations more quickly. However, in some instances a memory system may perform refresh operations on both valid data and invalid data.

Figure 7:
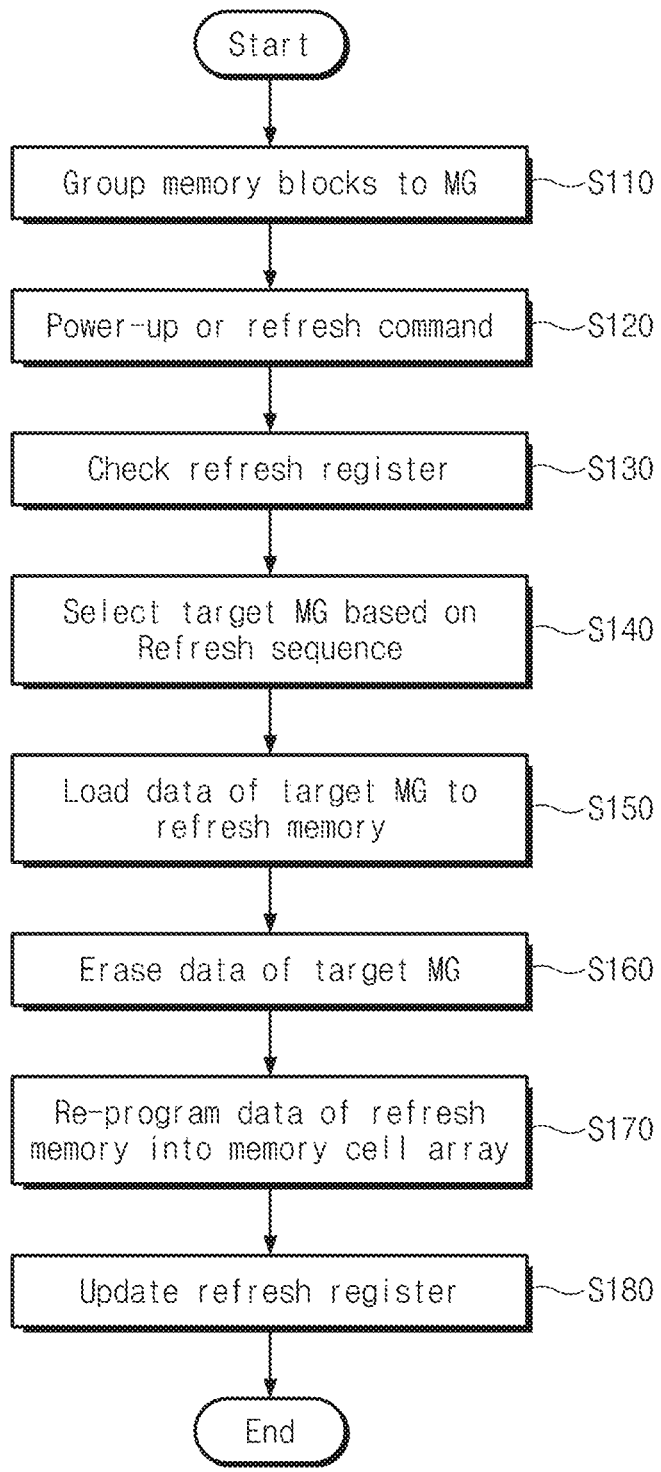
FIG. 7 is a flowchart diagram summarizing a refresh operation for the memory system of FIG. 2.

FIG. 7 is a flowchart diagram summarizing a refresh operation for the memory system of FIG. 2 according to an embodiment of the inventive context.

In step S110, the refresh manage module (RMM) 121 arranges memory blocks in memory groups (i.e., executes the grouping function). Further, the RMM 121 determines a refresh sequence for the memory groups. Address information and refresh sequence information for the memory groups are stored in the refresh register 122.

In step S120, the memory system is powered-on, or a refresh command is received. That is, in certain embodiments of the inventive concept, a refresh operation may be executed upon power-on. Alternatively or additionally, a refresh operation may be executed in response to an externally provided refresh command.

In step S130, the memory controller 120 confirms the refresh sequence information stored in the refresh register 122. In particular, the memory controller 120 may confirm a refresh sequence of memory groups and/or refresh groups according to the refresh sequence information stored in the refresh register 122. The memory controller 120 confirms address information for the memory groups and address information for the refresh groups when used. This information may be stored in the refresh register 122, and may include an indication of the last refreshed memory group.

In step S140, the memory controller 120 identifies a next refreshed memory group on the basis of the refresh sequence (e.g., based on the indicated last refreshed memory group), and then when the memory system is ready, selects the next refreshed memory group as the target memory group.

In step S150, data stored in the target memory group is loaded (i.e., copied) to the refresh memory 123. Only valid data may be copied to the refresh memory 123.

In step S160, an erase operation is then executed with respect to the target memory group.

In step S170, data stored in the refresh memory 123 is reprogrammed (i.e., re-copied) from the refresh memory 123 to an appropriate location in the memory cell array 131 (e.g., to the same or different memory blocks, per the description given in relation to FIGS. 4 and 5).

In step S180, address information stored in the refresh register 122 is updated in accordance with the results of the refresh operation. As part of this updated address information, the last refreshed memory group entry may be updated to reflect completion of the most recent refresh operation. In this manner, the established refresh sequence may be maintained.

According to the foregoing description, a memory system according to embodiments of the inventive concept may be implemented to refresh all memory groups storing data (or storing valid data). Accordingly, it is possible to better ensure the integrity of stored data. Further, since memory groups are defined and refreshed according to a refresh sequence determined by the refresh manage module (RMM) 121, it is possible to reduce memory system overhead. Further, it is possible to execute overall faster refresh operations when only valid data is considered.

Only a single non-volatile memory device has been described in relation to the foregoing embodiments. Memory systems according to embodiments of the inventive concept including two or more non-volatile memory devices will now be described with reference to FIGS. 8 through 21.

Figure 8:
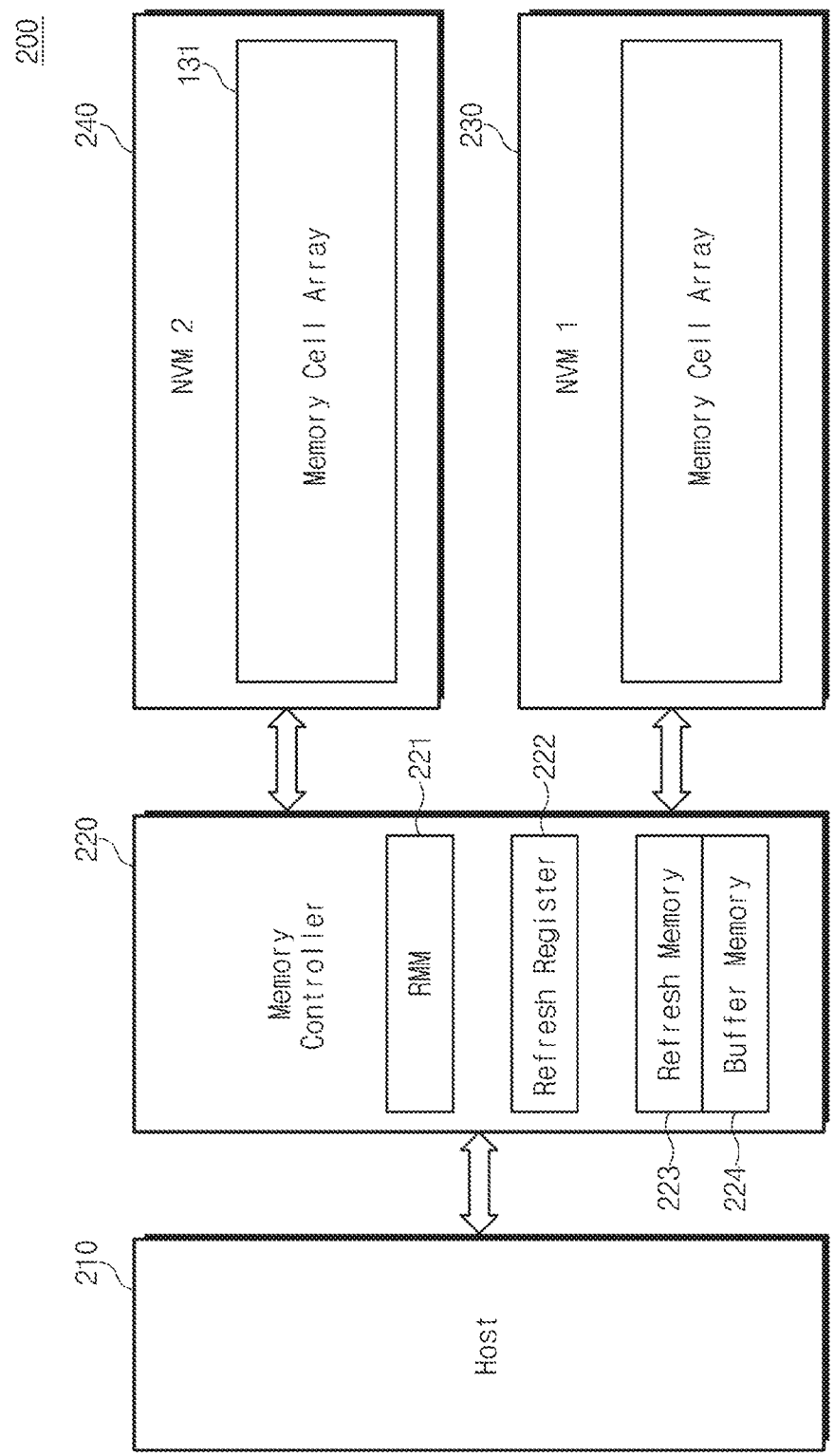
FIG. 8 is a block diagram illustrating a memory system according to another embodiment of the inventive concept.

FIG. 8 is a block diagram illustrating a memory system according to another embodiment of the inventive concept. Referring to FIG. 8, a memory system 200 generally comprises a memory controller 220, a first non-volatile memory device 230, and the second non-volatile memory device 240. The memory system 200 is connected to host 210 and is analogous to the memory system 100 of FIG. 2.

The memory controller 220 is connected between the host 210 and the first and second non-volatile memory devices 230 and 240. The memory controller 220 comprises a refresh manage module 221, a refresh register 222, a refresh memory 223, and a buffer memory 224.

As before, the refresh manage module 221 may be implemented to group memory blocks in the first and second non-volatile memory devices 230 and 240, where "grouping" is performed according to a refresh policy. Of note, memory groups may contain memory blocks from only the same non-volatile memory device, or may contain memory blocks from different non-volatile memory devices.

Again, as before, the refresh manage module 221 may determine a refresh sequence for defined memory groups, and the refresh register 222 may be used to store address information for the memory groups, memory blocks of each memory group, and the plurality of non-volatile memory devices in the memory system 200. The refresh register 222 may also be used to store refresh sequence information, and address information indicating a last refreshed memory group. Operation of the refresh register 222 may be understood in the embodiment of FIG. 8 to be similar to that of the previously described embodiments.

As before, the refresh memory 223 may be used to temporarily store data of a target memory group.

For example, if memory blocks of a target memory group are memory blocks in the first non-volatile memory device 230, data of the target memory group may be transferred to the refresh memory 223 from the first non-volatile memory device 230. If memory blocks of a target memory group are memory blocks in the second non-volatile memory device 240, data of the target memory group may be transferred to the refresh memory 223 from the second non-volatile memory device 240. And if memory blocks of a target memory group are memory blocks in both the first and second non-volatile memory devices 230 and 240, data of the target memory group may be transferred to the refresh memory 223 from both of the first and second non-volatile memory devices 230 and 240.

Again as before, the buffer memory 224 may be used to temporarily store write data and read data exchanged between the host 210 and the first and second non-volatile memory devices 230 and 240.

Figure 9:
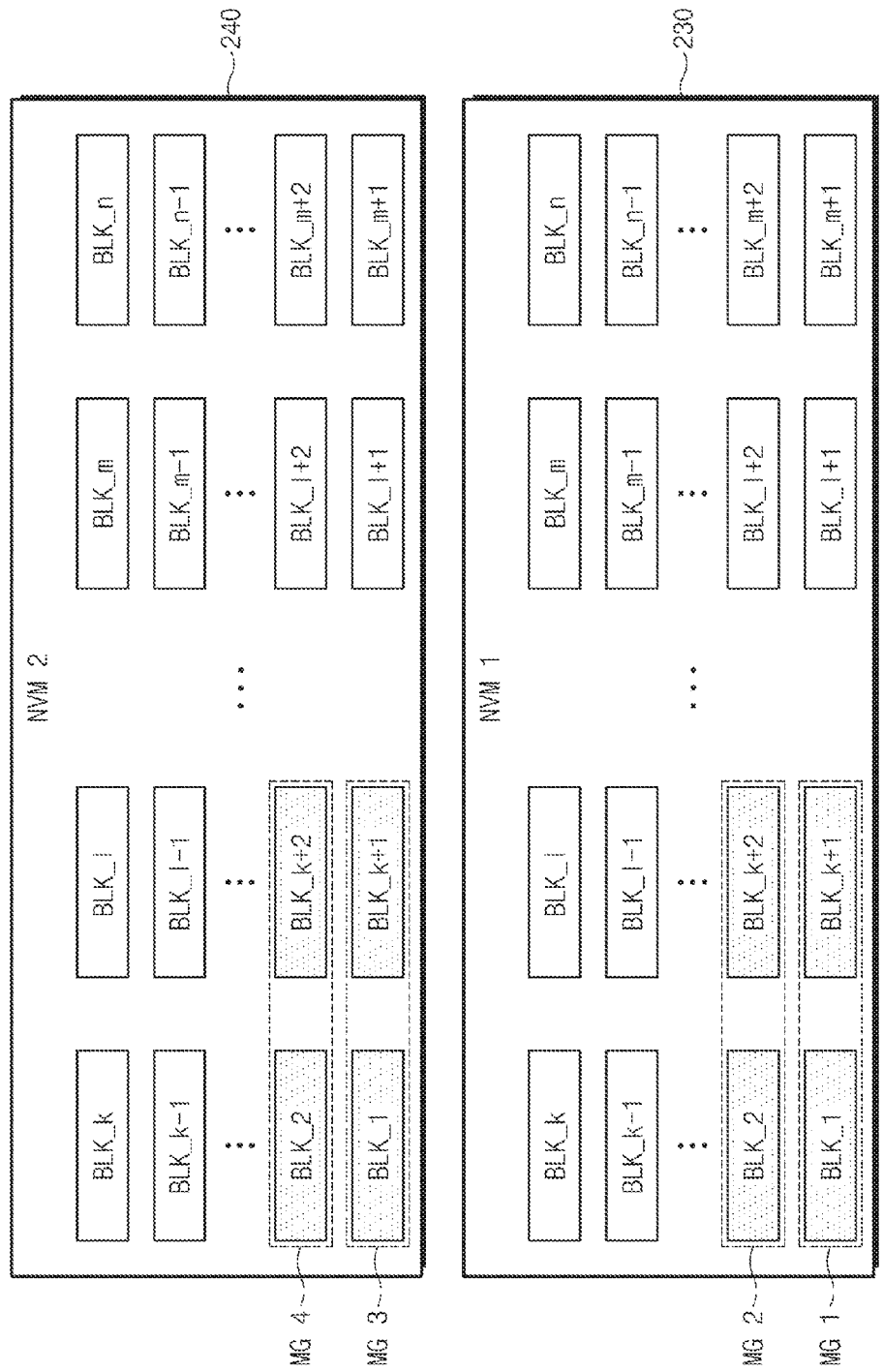
Figure 11:
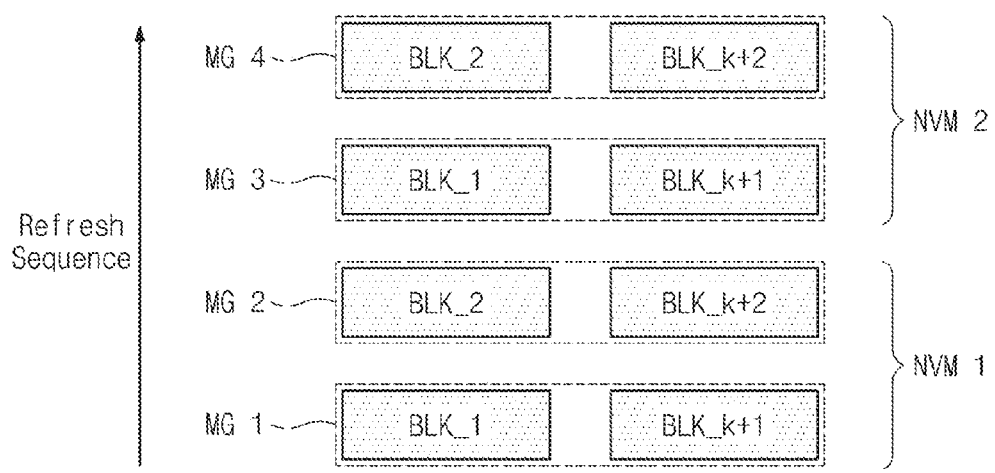

FIGS. 9, 10 and 11 are conceptual diagrams describing a refresh operation for the memory system of FIG. 8 according to certain embodiments of the inventive concept. Referring to FIGS. 9, 10 and 11 approaches to the grouping of memory blocks within a memory group are illustrated, wherein all memory blocks of a particular memory group are selected from the same non-volatile memory device.

Referring to FIG. 9, a few exemplary memory blocks of the first and second non-volatile memory devices 230 and 240 are shown. It is assumed that data has been programmed to the memory blocks BLK_1, BLK_2, BLK_k+1, and BLK_k+2 of the first non-volatile memory device 230, as indicated by the shaded boxes. It is also assumed that data has been programmed to the memory blocks BLK_1, BLK_2, BLK_k+1, and BLK_k+2 of the second non-volatile memory device 240.

Memory blocks of the first and second non-volatile memory devices 230 and 240 have been grouped into corresponding memory groups using the refresh manage module 221.

In the illustrated example of FIG. 9, the memory blocks BLK_1 and BLK_k+1 of the first non-volatile memory device 230 are grouped into a first memory group MG 1. Memory blocks BLK_2 and BLK_k+2 of the first non-volatile memory device 230 are grouped into a second memory group MG_2. Memory blocks BLK_1 and BLK_k+1 of the second non-volatile memory device 240 are grouped into a third memory group MG 3. Memory blocks BLK_2 and BLK_k+2 of the second non-volatile memory device 240 are grouped into a fourth memory group MG 4.

The number and grouping of memory blocks in each memory group will be defined according to an established refresh policy. The example illustrated in FIG. 9 mandates that only memory blocks in a common row (i.e., connected to a common word line) may be grouped into a memory group. This is clearly just one example of memory block grouping, and memory blocks might just as easily be grouped according to a common column (i.e., connected to one or more common bit lines). For the sake of simplicity, FIG. 9 shows only two (2) memory blocks grouped into a memory group, but those skilled in the art will recognize that more than two memory blocks may be grouped.

Referring to FIG. 10, address information for the memory groups of FIG. 9, for the constituent memory blocks of each memory group, and for the non-volatile memory devices is conceptually illustrated in table form. This type of correlated (e.g., hierarchical) address information may be stored in the refresh register 222.

Referring to FIG. 11, a refresh operation for the memory groups of FIG. 9 is illustrated. A refresh sequence for the defined memory groups MG 1, MG 2, MG 3, and MG 4 may be determined by the refresh manage module 221. FIG. 10 shows a simple ascending order refresh sequence defined in relation to an ordered arrangement of word lines in the non-volatile memory device, as well as an ordered arrangement of the non-volatile memory devices.

In the event that a refresh operation is directed to the first memory group MG 1, data stored in the first memory group MG 1 is copied to the refresh memory 223, and an erase operation is executed for the memory blocks of the first memory group MG 1. Following the erase operation, data stored in the refresh memory 223 may be copied back to these same memory blocks or copied to different memory blocks. Following completion of the operation directed to the first memory block MG 1, information stored in the refresh register 222 is updated, as previously described. It should be noted, that where "different memory blocks" are used to receive the target memory groups data, such memory blocks may be disposed in the same non-volatile memory device and/or a different non-volatile memory device.

Referring still to FIG. 11, in a case where a next refresh operation is requested, the memory controller 220 confirms the updated refresh information stored in the refresh register 222, and then proceeds to execute the refresh operation in relation to the next refreshed memory group (e.g., the second memory group MG 2).

Figure 12:
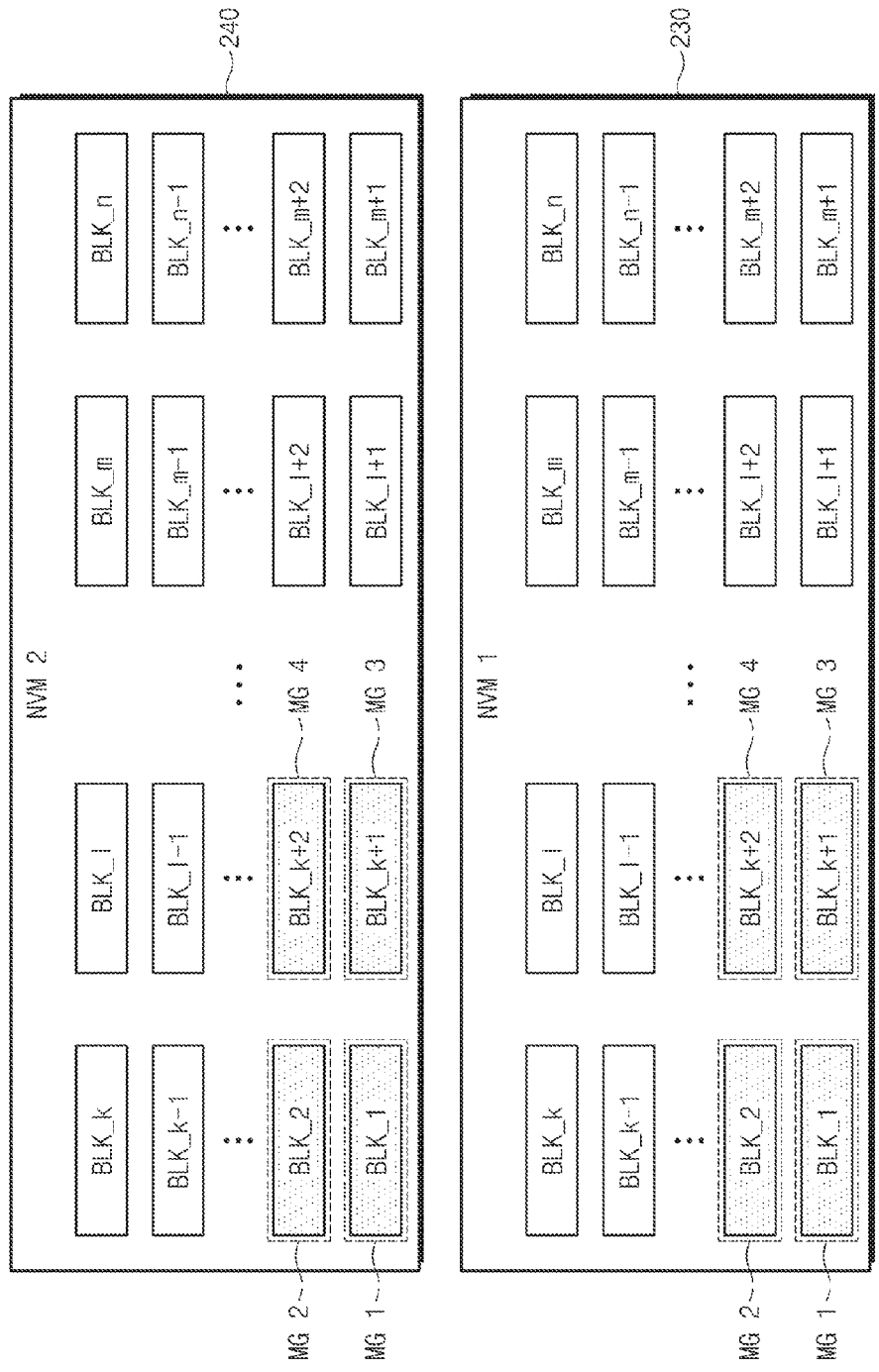
Figure 14:
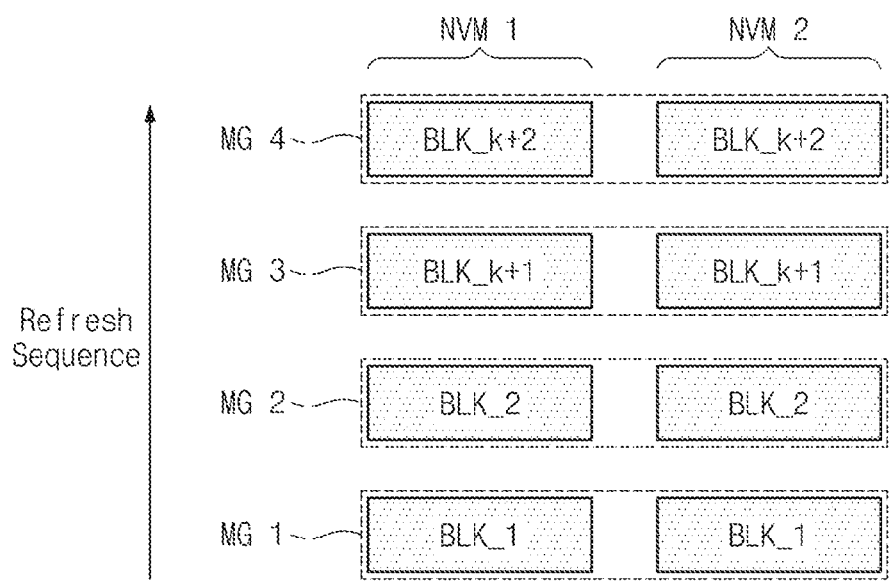

FIGS. 12, 13 and 14 are conceptual diagrams describing a refresh operation for the memory system in FIG. 8 according to another embodiment of the inventive concept. In FIGS. 12, 13 and 14, there is shown an example wherein a memory group includes memory blocks selected from different non-volatile memory devices.

Referring to FIG. 12, memory blocks of the first and second non-volatile memory devices 230 and 240. It is assumed that data has been stored in memory blocks BLK_1, BLK_2, BLK_k+1, and BLK_k+2 of the first non-volatile memory device 230 and memory blocks BLK_1, BLK_2, BLK_k+1, and BLK_k+2 of the second non-volatile memory device 240.

The refresh manage module 221 manages memory blocks of the first and second non-volatile memory devices 230 and 240 according to a defined grouping function. Here, for example, it is possible to define a memory group to include memory blocks from different memory devices.

As shown in FIG. 12, a first memory block BLK_1 of the first non-volatile memory device 230 and a first memory block BLK_1 of the second non-volatile memory device 240 are grouped into a first memory group MG 1. A second memory block BLK_2 of the first non-volatile memory device 230 and a second memory block BLK_2 of the second non-volatile memory device 240 are arranged in a second memory group MG 2. A third memory block BLK_k+1 of the first non-volatile memory device 230 and a third memory block BLK_k+1 of the second non-volatile memory device 240 are grouped into a third memory group MG 3, and a fourth memory block BLK_k+2 of the first non-volatile memory device 230 and a fourth memory block BLK_k+2 of the second non-volatile memory device 240 are grouped into a fourth memory group MG 4.

The number of memory blocks in each memory group and the manner of grouping across a plurality of non-volatile memory devices may be variously defined according to a refresh policy. As previously suggested, the number of and disposition relationship(s) between memory blocks grouped into a memory group is a matter of design choice.

Referring to FIG. 13, there are shown address information for memory groups of FIG. 12, for memory blocks within each memory group, and address information for the non-volatile memory devices in the memory system 200. The address information summarized in table form by FIG. 13 may be stored in the refresh register 222.

Referring to FIG. 14, a refresh operation for the memory groups of FIG. 12 will be described. As before, the refresh manage module 221 may be used to group memory blocks into defined memory groups, whereupon corresponding address information for the memory groups may be stored in the refresh register 222 as illustrated in FIG. 13. The refresh manage module 221 also determines the refresh sequence for the memory groups MG 1 through MG 4. Here again, a simple ascending order refresh sequence is assumed in FIG. 14.

When a refresh operation is directed to the first memory group MG 1, data stored in the memory group MG 1 is copied to the refresh memory 223. That is, data from the first memory block BLK_1 of the first non-volatile memory device 230 is copied to the refresh memory 223, then data from the first memory block BLK_1 of the second non-volatile memory device 240 is copied to the refresh memory 223. Data from the respective first memory blocks may be copied to the refresh memory 223 from the first and second memory devices 230 and 240 in series or in parallel, depending on the connectivity and bandwidth between the memory controller 220 and the corresponding non-volatile memory devices.

Afterwards, an erase operation is directed to the memory blocks of the first memory group MG 1. That is, an erase operation is carried out with respect to the first memory block BLK_1 of the first non-volatile memory device 230 and the first memory block BLK_1 of the second non-volatile memory device 240. Erase operations directed to the first and second non-volatile memory devices 230 and 240 may be performed in series or in parallel, depending on current consumption constraints.

After the erase operations have been executed, data stored in the refresh memory 223 may be copied-back to the original memory blocks and/or to different memory blocks. Afterwards, information indicating the results of the refresh operation directed to the first memory group MG 1 may be stored in the refresh register 222.

Referring to FIG. 13, in a case where a next refresh operation is requested, the memory controller 220 confirms refresh information stored in the refresh register 222. That is, the memory controller 220 checks a refresh sequence and a completion of a refresh operation for the first memory group MG 1 depending on information stored in the refresh register 222. Afterwards, the memory controller 220 may execute a refresh operation directed to the second memory group MG 2.

As described above, a memory system according to embodiments of the inventive concept may include a plurality of non-volatile memory devices. Yet, it is possible to better secure the integrity of stored data by providing a refresh operation with respect memory groups that may be defined per non-volatile memory device, or across a number of non-volatile memory devices.

Figure 15:
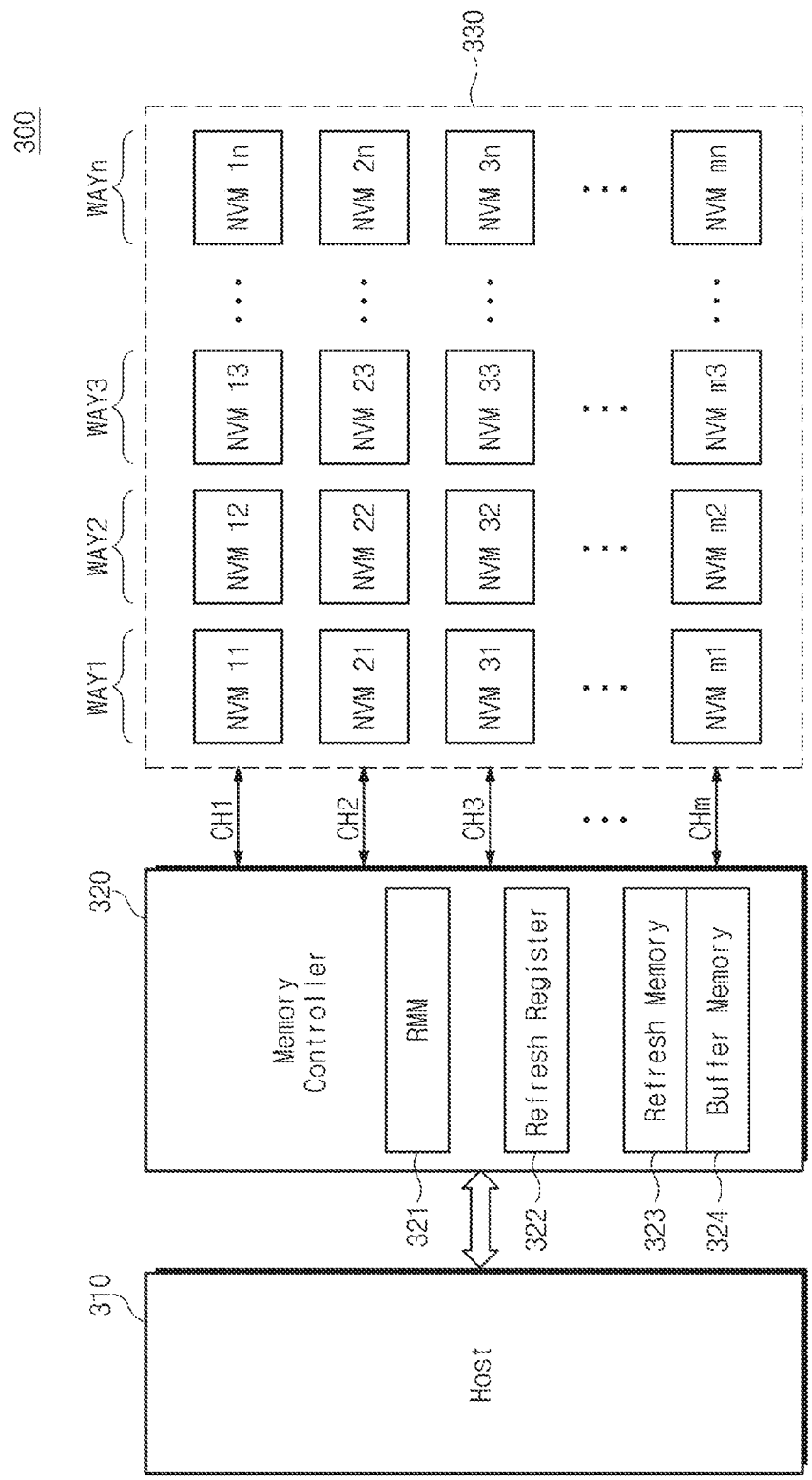
FIG. 15 is a block diagram illustrating a memory system according to still another embodiment of the inventive concept.

FIG. 15 is a block diagram showing a memory system according to yet another embodiment of the inventive concept.

Referring to FIG. 15, a memory system 300 generally comprises a memory controller 320 and a memory device 330. The memory system 300 is connected to a host 310 and is substantially similar to the memory system described in relation to FIG. 8, except that it includes a greater plurality of non-volatile memory devices arranged in a N×M array of non-volatile memory devices 330. Within the memory system 300, analogous system elements (3XX) are numbered analogously with respect to corresponding system elements of memory system 200 (2XX).

Here again, the refresh manage module 321 manages the grouping of memory blocks into memory groups according to an established refresh policy.

Figure 16:
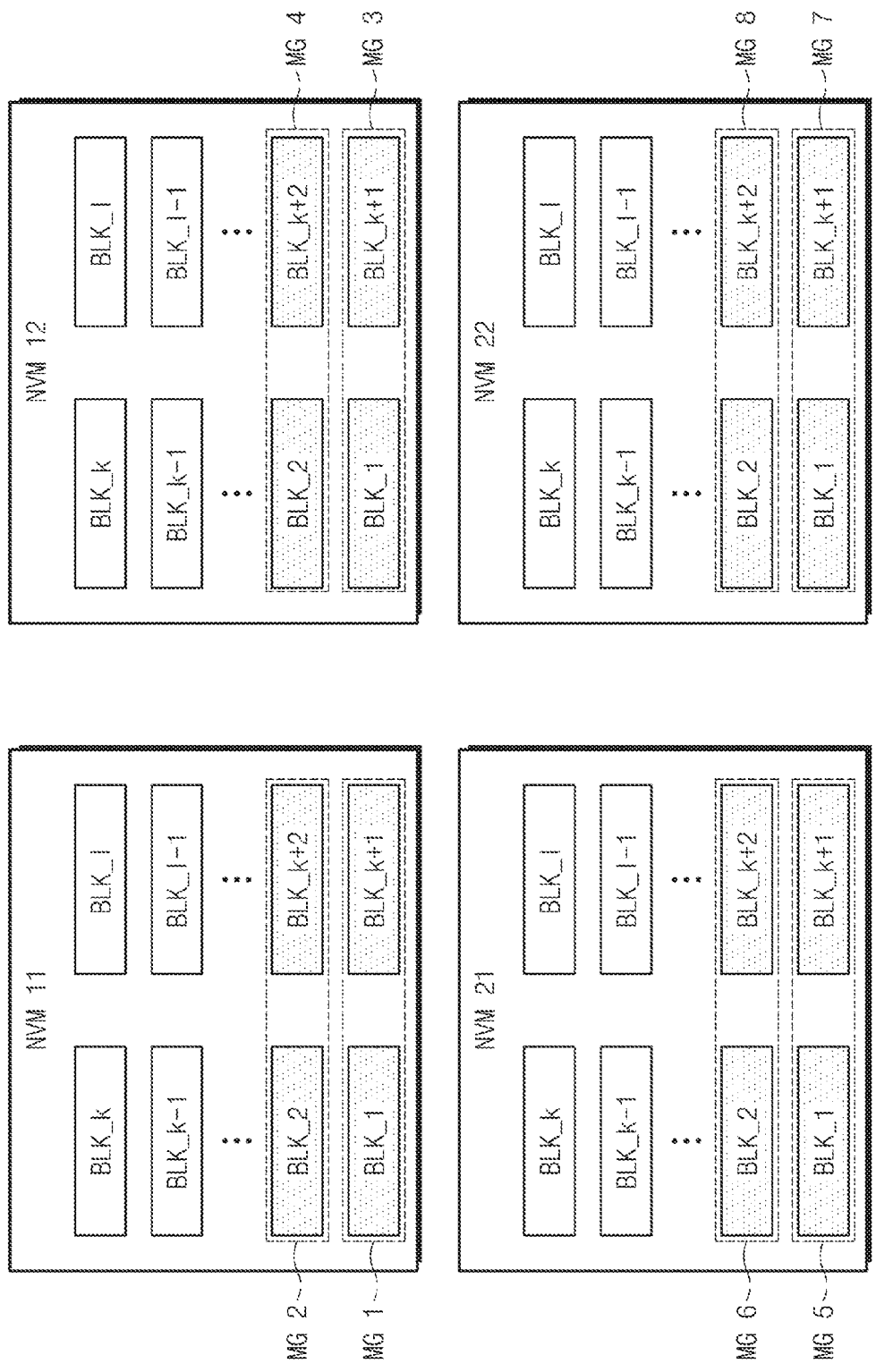
Figure 18:
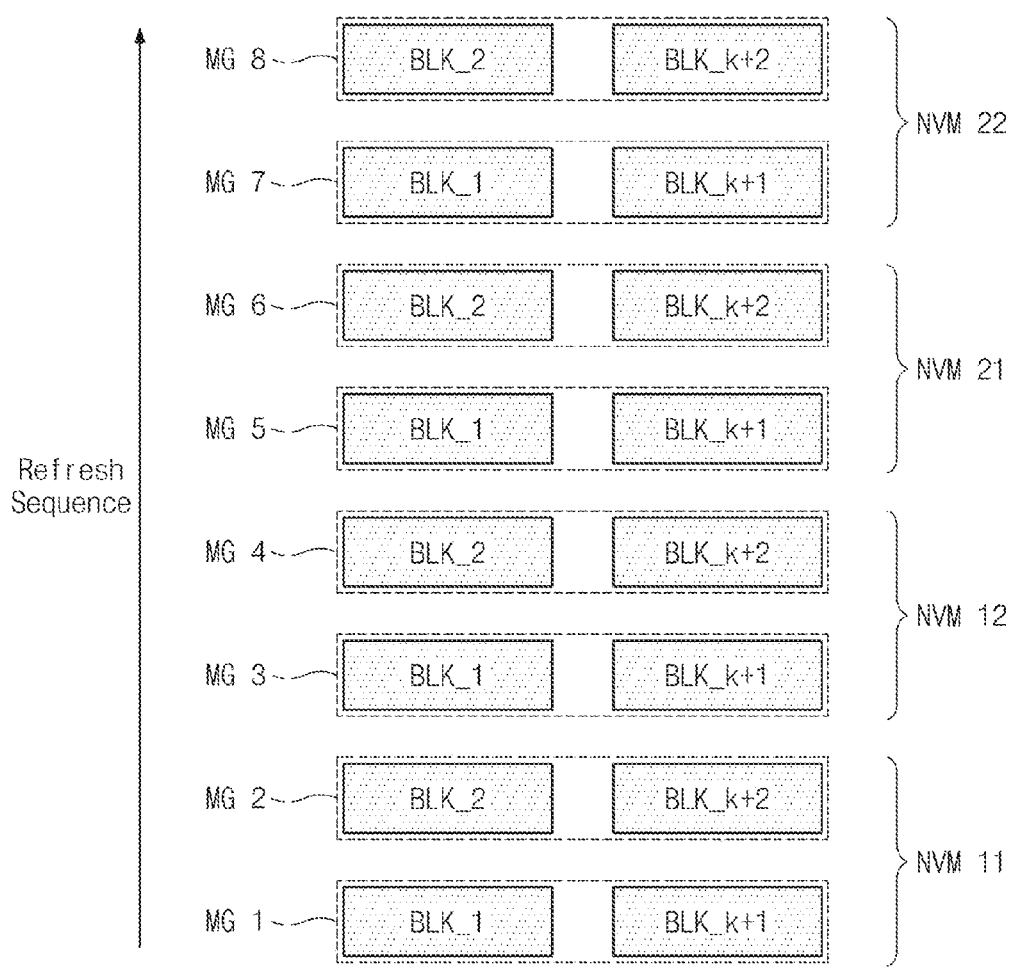
Figure 19:
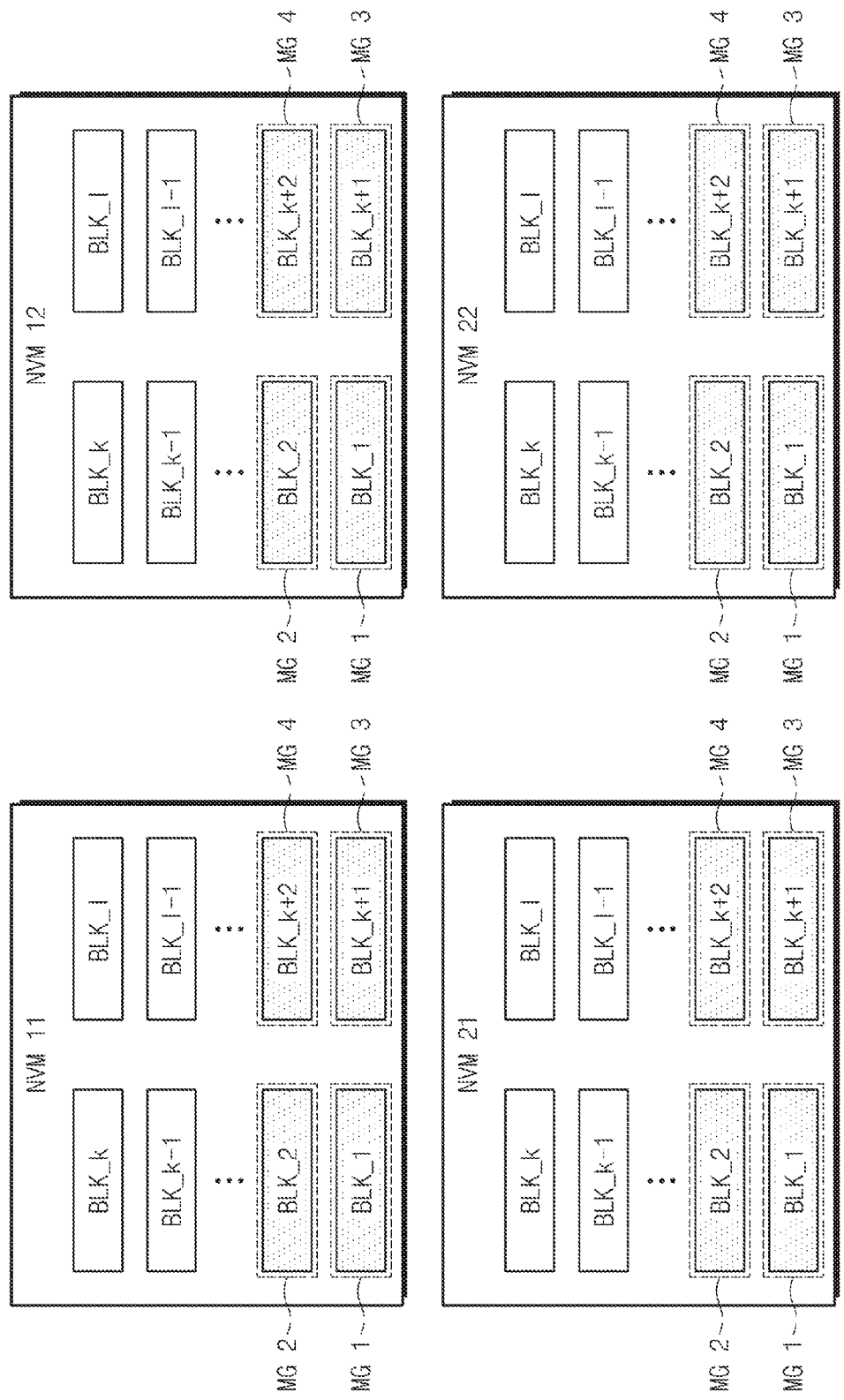
Figure 21:
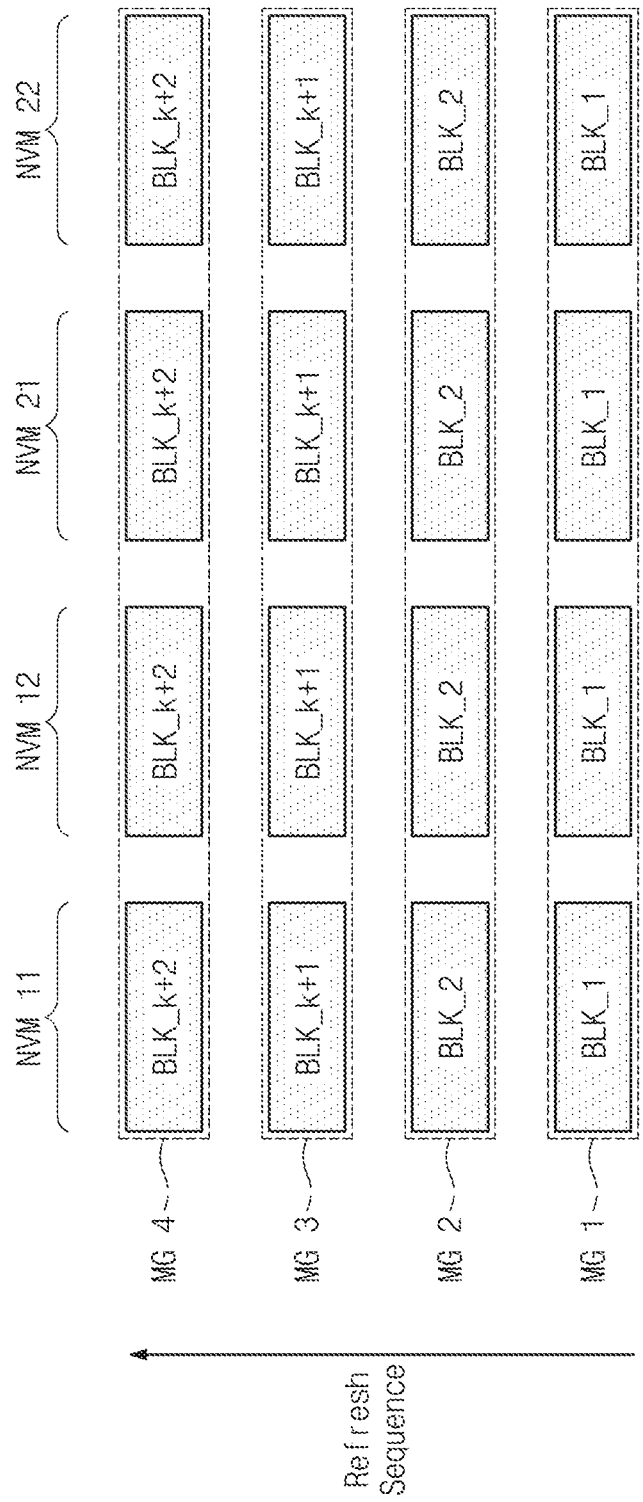

For example, a memory group may be defined to include memory blocks from the same non-volatile memory device, as shown in FIGS. 16 to 18. However, a memory group may alternately be defined to include memory blocks from different non-volatile memory devices, as shown in FIGS. 19 to 21.

Again as before, the refresh manage module 321 may be used to determine a refresh sequence for defined memory groups.

Referring to FIG. 15, the array of memory device 330 includes a plurality of non-volatile memory devices NVM 11 through NVM mn. The plurality of non-volatile memory devices NVM 11 to NVM mn may be used, for example, to store large quantities of media data within the memory system 300. In certain embodiments of the inventive concept, the plurality of non-volatile memory devices NVM 11 to NVM mn may be flash memory devices. In other embodiments, the plurality of non-volatile memory devices NVM 11 to NVM mn may be PRAM, MRAM, ReRAM, FRAM, and the like.

The plurality of non-volatile memory devices NVM 11 to NVM mn are connected to the memory controller 320 via a plurality of channels CH1 to CHm. One channel may be used to connected one or more non-volatile memory devices within the array of memory devices 330. Memory devices connected via a particular channel may be connected within the array of memory devices 330 via a common data bus.

The plurality of non-volatile memory devices NVM 11 to NVM mn are controlled in their operation by the memory controller 320. For example, the memory controller 320 may select one or more non-volatile memory devices connected via a particular channel. Read d stored retrieved from the selected memory device(s) may then be transferred to the memory controller 320, or write data may be transferred from the memory controller 320 to the selected memory device(s).

Respective non-volatile memory devices perform a read, erase, or program operation in parallel. Write data and/or read data may be transferred in parallel as memory devices in the array of memory devices are connected to the memory controller 320 via different channels.

For example, in the illustrated example of FIG. 15, a non-volatile memory device NVM 11 connected via the first channel CH1 and a non-volatile memory device NVM 21 connected via the second channel CH2 may execute read operations in parallel. Since the memory devices NVM 11 and NVM 21 are connected via different channels, data read from multiple memory devices may be transferred in parallel to the memory controller 320.

When a read, erase, or program operations are carried out with respect to non-volatile memory devices connected via the same channel to the memory controller 320, write data and/or read data will be transferred in series.

In the illustrated example of FIG. 15, a non-volatile memory device NVM 11 is connected via the first channel CH1 and is included in the first way WAY1 (e.g., a columnar arrangement of individual non-volatile memory devices in the array of non-volatile memory devices). A non-volatile memory device NVM 12 is also connected via the first channel CH1 but is included in the second way WAY2. Since the memory device NVM 11 and NVM 12 belong to different ways, they may perform read operations in parallel. But, since the memory devices NVM 11 and NVM 12 are connected to the same channel, read data respectively retrieved from the memory devices NVM 11 and NVM 12 may be transferred to the memory controller 320 in series.

The non-volatile memory devices NVM 11 to NVM mn are configured to be similar to non-volatile memory devices 230 and 240 in FIG. 8, and description thereof is thus omitted. A refresh operation of a memory system 300 in FIG. 15 will be more fully described with reference to FIGS. 16 to 21 below.

FIGS. 16, 17 and 18 are conceptual diagrams describing a refresh operation for the memory system in FIG. 15 according to an embodiment of the inventive concept. In FIGS. 16, 17 and 18, there is shown the case that one memory group is formed to include memory blocks in the same non-volatile memory device.

Referring to FIG. 16, there are illustrated some memory devices NVM 11, NVM 12, NVM 21, and NVM22 of non-volatile memory devices NVM 11 to NVM mn in the array of memory devices 330. It is assumed that data is stored in memory blocks BLK_1, BLK_2, BLK_k+1, and BLK_k+2 in each of the non-volatile memory devices NVM 11, NVM 12, NVM 21, and NVM 22 as illustrated by a shaded box.

The refresh manage module 321 manages memory blocks of the non-volatile memory devices NVM 11, NVM 12, NVM 21, and NVM 22 in the above-described grouping manner. For example, as illustrated in FIG. 16, one memory group is formed to include memory blocks of the same non-volatile memory device.

That is, memory blocks BLK_1 and BLK_k+1 of the non-volatile memory device NVM 11 may constitute a memory group MG 1. Memory blocks BLK_2 and BLK_k+2 of the non-volatile memory device NVM 11 may constitute a memory group MG_2. Likewise, memory blocks of the non-volatile memory devices NVM 12 to NVM 22 may be arranged in memory groups MG 3 to MG 8.

The number of memory blocks in each memory group and a grouping manner may be defined variously according to a refresh policy. For example, in FIG. 16, it is assumed that grouping of memory blocks is made in a row direction and each memory group includes two memory blocks. But, each memory group can be formed of one memory block. Each memory group can include at least three memory blocks.

FIG. 17 shows in table form address information for the memory groups of FIG. 16, and address information for the memory blocks within each memory group as well as the non-volatile memory devices. In the illustrated example, a memory group MG 1 includes memory blocks BLK_1 and BLK_k+1 of a non-volatile memory device NVM 11. Address information of FIG. 17 may be stored in the refresh register 322.

Referring to FIG. 18, there is shown a refresh operation for the memory groups of FIG. 16. As described in FIG. 16, the refresh manage module 321 manages memory blocks in a grouping manner. For example, memory blocks BLK_1 and BLK_k+1 of a non-volatile memory device NVM 11 may constitute a memory group MG 1. As described in FIG. 17, address information of memory groups and address information of memory blocks in each memory group and a non-volatile memory device may be stored in the refresh register 322.

Further, the refresh manage module 321 determines a refresh sequence of memory groups MG 1 to MG 8. For example, in FIG. 18, there is shown the example that memory groups MG 1 to MG 8 are refreshed sequentially.

When a refresh operation is requested to the memory group MG 1, data stored in the memory group MG 1 is transferred to the refresh memory 323. Afterwards, an erase operation is carried out with respect to the memory group MG 1. After the erase operation is carried out, data stored in the refresh memory 323 is reprogrammed. Information indicating that a refresh operation for the memory group MG 1 is completed is stored in the refresh register 322.

In this case, data stored in the refresh memory 323 can be copied-back to memory blocks different from memory blocks of the memory group MG 1. That is, data stored in a target memory group may be copied-back to different memory blocks. Data stored in the refresh memory 223 may alternately be copied-back to the same memory blocks as memory blocks of the memory group MG 1. That is, data of a target memory group can be reprogrammed in blocks of the target memory group. This operation is similar to that described in FIG. 11, and description thereof is thus omitted.

Continuing to refer to FIG. 18, when a next refresh operation is requested, the memory controller 320 confirms refresh information stored in the refresh register 322. That is, the memory controller 320 confirms a refresh sequence and whether a refresh operation for the memory group MG 1 is completed, depending on information stored in the refresh register 322. Afterwards, the memory controller 320 controls a refresh operation with respect to a memory group MG 2.

A refresh operation of a memory system 300 in FIG. 15 is described in FIGS. 16 to 18 under the condition that a memory group is formed of memory blocks of the same non-volatile memory device. However, the inventive concept is not limited to this configuration, and a memory group may be formed of memory blocks from different non-volatile memory devices. This approach will be more fully described with reference to FIGS. 19, 20 and 21.

FIGS. 19, 20 and 21 are conceptual diagrams describing a refresh operation for the memory system of FIG. 15 according to another embodiment of the inventive concept. In FIGS. 19, 20 and 21, there is shown a case wherein a memory group is formed from memory blocks selected from different non-volatile memory devices.

Referring to FIG. 19, there are illustrated some memory devices NVM 11, NVM 12, NVM 21, and NVM22 of non-volatile memory devices NVM 11 to NVM mn of a memory device 330. It is assumed that data is stored in memory blocks BLK_1, BLK_2, BLK_k+1, and BLK_k+2 in each of the non-volatile memory devices NVM 11, NVM 12, NVM 21, and NVM 22 as illustrated by a shaded box.

The refresh manage module 321 groups memory blocks of the non-volatile memory devices NVM 11, NVM 12, NVM 21, and NVM 22 according to a refresh policy. For example, as illustrated in FIG. 19, a memory group is formed from memory blocks selected from different non-volatile memory devices.

That is, a memory block BLK_1 of the non-volatile memory devices NVM 11 to NVM 22 may constitute a memory group MG 1. A memory block BLK_2 of the non-volatile memory devices NVM 11 to NVM 22 may constitute a memory group MG 2. A memory block BLK_3 of the non-volatile memory devices NVM 11 to NVM 22 may constitute a memory group MG 3, and a memory block BLK_4 of the non-volatile memory devices NVM 11 to NVM 22 may constitute a memory group MG 4.

The number of memory blocks in each memory group and a grouping manner may be defined variously according to the refresh policy. For example, in FIG. 19, it is assumed that a memory group is formed of four memory blocks in different memory devices. But, each memory group can include at least two memory blocks in different memory devices, which is similar to that described in FIG. 12.

Referring to FIG. 20, address information for the memory groups shown in FIG. 16 and address information of memory blocks in each memory group and a non-volatile memory device is shown in table form.

As illustrated, the memory group MG 1 includes memory blocks BLK_1 of non-volatile memory devices NVM 11 to NVM 22; the memory group MG 2 includes memory blocks BLK_2 of non-volatile memory devices NVM 11 to NVM 22, etc. Address information shown in FIG. 20 may be stored in the refresh register 322.

Referring to FIG. 21, there is shown a refresh operation for the memory groups of FIG. 19. As described in FIG. 19, the refresh manage module 321 has previously grouped memory blocks into memory groups. As described in FIG. 20, address information of memory groups and address information of memory blocks in each memory group and a non-volatile memory device may be stored in a refresh register 322.

Further, the refresh manage module 321 determines a refresh sequence of memory groups MG 1 to MG 4. For example, in FIG. 21, there is shown the example that memory groups MG 1 to MG 4 are refreshed in an ascending order sequence.

When a refresh operation is requested to a memory group MG 1, data stored in the memory group MG 1 is copied to the refresh memory 323. That is, data of memory blocks BLK_1 of the non-volatile memory devices NVM 11 to NVM 22 may be copied to the refresh memory 323. Non-volatile memory devices NVM 11 to NVM 22 perform read operations to respective memory block BLK_1 in parallel. Read data may be transferred to the refresh memory 323 via channels CH1 and CH2 connected with the non-volatile memory devices NVM 11, NVM 12, NVM 21, and NVM 22.

In this case, the non-volatile memory device NVM 11 and the non-volatile memory device NVM 21 are connected to the memory controller 320 via channels CH1 and CH2, respectively. Accordingly, data read from the device NVM 11 and data read from the device NVM 21 may be sent in parallel to the refresh memory 323.

Further, the non-volatile memory device NVM 11 and NVM 12 share the channel CH1. That is, the non-volatile memory device NVM 11 and NVM 12 are connected to the memory controller 320 via the channel CH1. Accordingly, data read from the device NVM 11 and data read from the device NVM 12 may be sent in series to the refresh memory 323.

Afterwards, an erase operation is carried out with respect to the memory blocks of the memory group MG 1. That is, memory blocks BLK_1 of the non-volatile memory devices NVM 11, NVM 12, NVM 21, and NVM 22 may be erased. In this case, memory blocks BLK_1 of the non-volatile memory devices NVM 11, NVM 12, NVM 21, and NVM 22 may be erased in parallel.

After the erase operation(s) are executed, data stored in the refresh memory 323 may be copied back to designated locations in the memory cell array 131. Information indicating that a refresh operation for the memory group MG 1 is completed is stored in the refresh register 322.

In this case, data stored in the refresh memory 323 can be reprogrammed in memory blocks different from memory blocks of the memory group MG 1. That is, data stored in a target memory group is reprogrammed in different memory blocks. Data stored in the refresh memory 223 can be copied-back to the same memory blocks as memory blocks of the memory group MG 1. That is, data of a target memory group can be reprogrammed in the same memory blocks of the target memory group. This operation is similar to that described in FIGS. 11 and 14, and description thereof is thus omitted.

Data may be copied back to various memory blocks of non-volatile memory devices via different channels. For example, data stored in the refresh memory 323 may be copied-back to the non-volatile memory device NVM 11 via the channel CH1, and to the non-volatile memory device NVM 21 via the channel CH2. Since non-volatile memory devices are connected to the memory controller 320 via different channels, data stored in the refresh memory 323 may be sent to the memory devices NVM 11 and NVM 21 in parallel.

Alternately, when data stored in the refresh memory 323 is copied-back, said data may be reprogrammed to the memory blocks of the non-volatile memory devices using the same channel. For example, data stored in the refresh memory 323 may be copied-back to the non-volatile memory devices NVM 11 and NVM 12 via the channel CH1. Since the non-volatile memory devices NVM 11 and NVM 12 are connected to the memory controller 320 via the same channel, data stored in the refresh memory 323 may be sent in series to the non-volatile memory devices NVM 11 and NVM 12.

Referring still to FIG. 21, when a next refresh operation is requested, a memory controller 320 confirms refresh information stored in the refresh register 322. That is, the memory controller 320 confirms a refresh sequence and whether a refresh operation for the memory group MG 1 is completed, depending on information stored in the refresh register 322. Afterwards, the memory controller 320 controls a refresh operation with respect to a memory group MG 2.

As described above, a memory system according to embodiments of the inventive concept may include N non-volatile memory devices (N being 2 or more integer). It is possible to better secure the integrity of stored data by providing a refresh operation with respect memory groups defined from the N memory devices according to a given refresh sequence.

Of further note, a refresh operation may be performed during every clock period for a defined clocking function. This will be more fully described with reference to FIG. 22.

Figure 22:
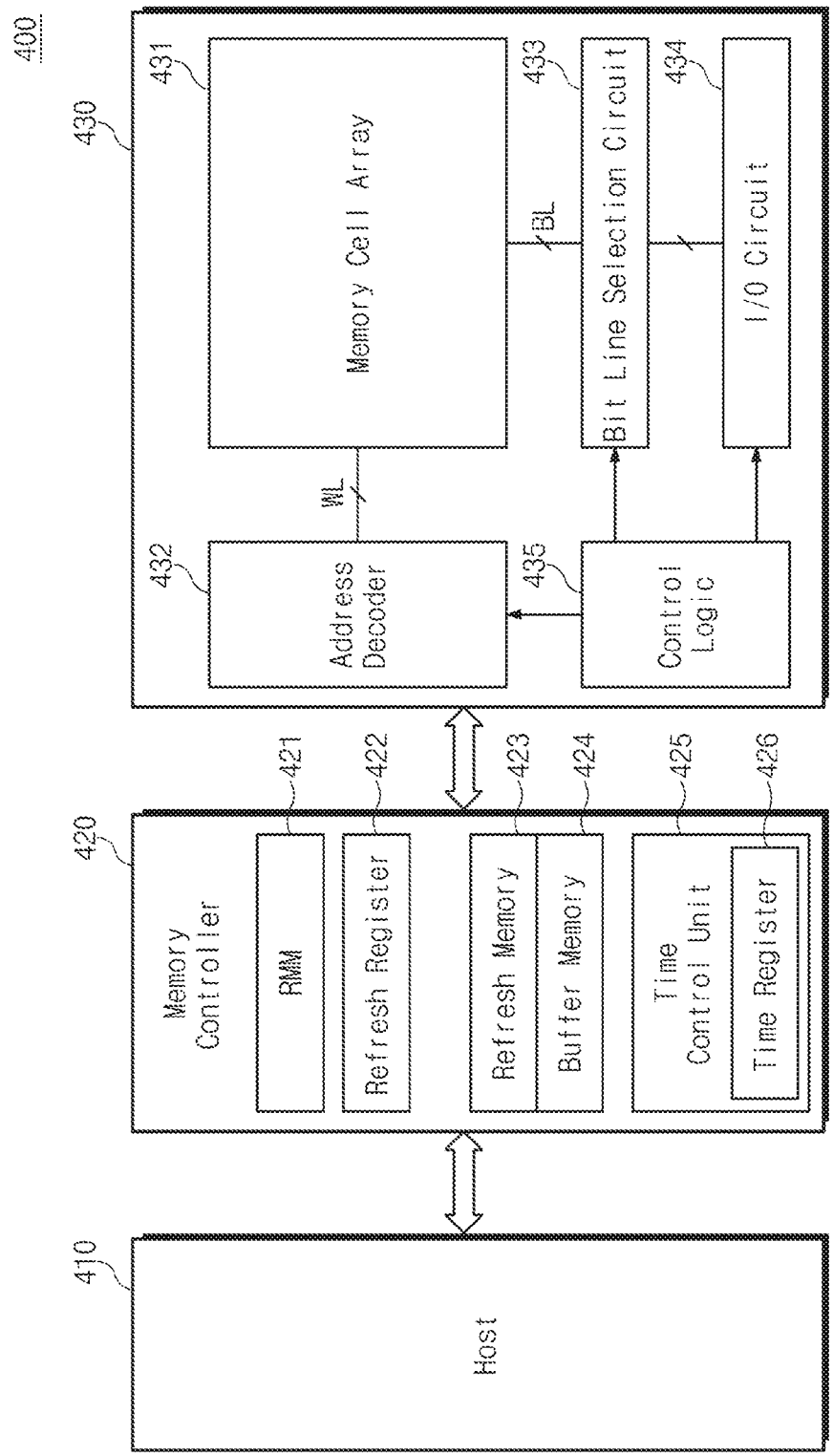
FIG. 22 is a block diagram illustrating a memory system according to a still another embodiment of the inventive concept.

FIG. 22 is a block diagram illustrating a memory system according to yet another embodiment of the inventive concept.

Referring to FIG. 22, a memory system 400 is connected to a host 410, and comprises a memory controller 420 and a non-volatile memory device 430. The memory system 400 of FIG. 22 is similar to that in FIG. 2.

A time control unit 425 determines a refresh period within the memory system 400. For example, the time control unit 425 may determine a refresh period considering a memory group number and a data retention critical time. Herein, the term "data retention critical time" denotes a maximum period of time between refresh operations that ensure the integrity of stored data. The time control unit 425 may determine a refresh period $P_{RFS}$ using a relationship of T/N, wherein, T indicates a data retention critical time, and N indicates a memory group number. If T is 100 days and N is 10, the time control unit 425 determines the refresh period $P_{RFS}$ to be 10.

In another embodiment, the time control unit 425 determines a refresh period considering a total number of memory blocks, a grouping unit of memory groups, and a data retention critical time. Herein, the memory blocks may include memory blocks each storing data and memory blocks each storing no data. The time control unit 425 determines a refresh period $P_{RFS}$ using the relationship T/(Nt/Ug), wherein Nt indicates a total number of memory blocks and Ug indicates a grouping unit indicating that one memory group is formed of N memory blocks. If T is 100 days, Nt is 100, and Ug is 4, the time control unit 425 determines the refresh period $P_{RFS}$ to be 4.

Further, the time control unit 425 may calculate a difference between a current time and a final refresh end time and compare the difference with a refresh period. The time control unit 425 generates an interrupt signal when a difference between a current time and a final refresh end time is over the refresh period. Herein, the final refresh end time means an end time for a last refresh operation time.

For example, if a refresh period is four days and a difference between a current time and a last refresh operation time exceeds four days, the time control unit 425 generates an interrupt signal. The memory controller 420 responds to the interrupt signal and controls the non-volatile memory device 430 to perform a refresh operation. For example, the time control unit 425 may access a time register 426 to acquire a refresh period and last refresh operation end time. The time control unit 425 can acquire current time information from an external source, and the time register 426 may store the refresh period and a last refresh operation time.

As illustrated in FIG. 22, the non-volatile memory device 430 is connected to the memory controller 420. The non-volatile memory device 430 as illustrated comprises a memory cell array 431, an address decoder 432, a bit line selection circuit 433, an input/output (I/O) circuit 434, and control logic 435. The non-volatile memory device 430 in FIG. 22 is similar to that in FIG. 2, and description thereof is thus omitted.

Figure 23:
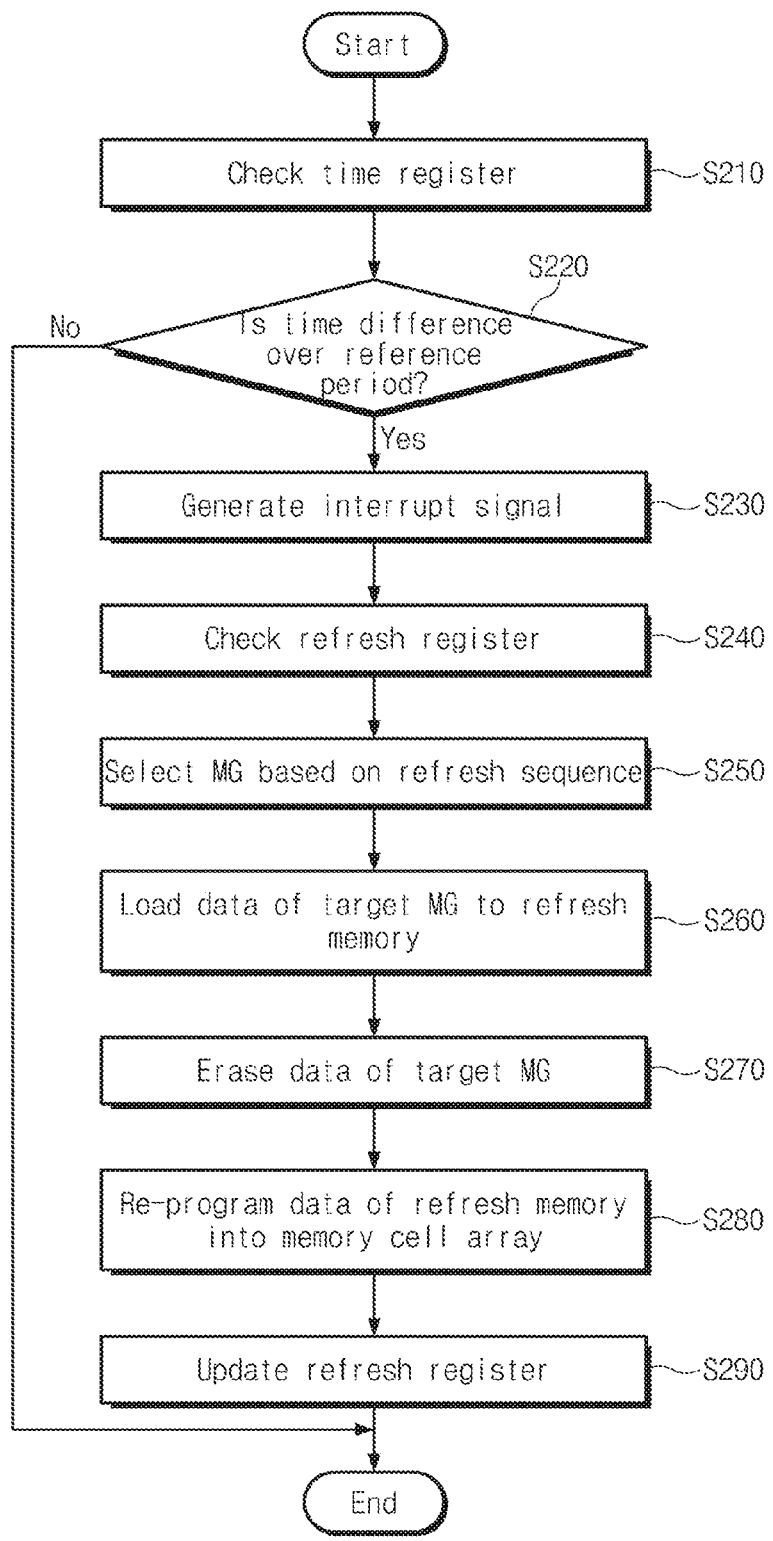
FIG. 23 is a flowchart diagram summarizing a refresh operation for the memory system of FIG. 22.

FIG. 23 is a flowchart diagram summarizing a refresh operation for the memory system of FIG. 22.

In step S210, the time control unit 425 checks time information stored in the time register 426. For example, the time control unit 425 may check a refresh period stored in the time register 426. Further, the time control unit 425 may check a last refresh operation time stored in the time register 426.

In step S220, the time control unit 425 compares a refresh period with a difference between a current time and the last refresh operation time. If the determined difference is less than the refresh period, no refresh operation is executed. However, if the difference is greater than the refresh period, in step S230, the time control unit 425 generates an interrupt signal. In this case, a set of operations S240 through S270 is executed to perform a refresh operation.

In step S240, the memory controller 420 checks refresh information stored in the refresh register 422. In step S250, the memory controller 420 selects a target memory group based on a refresh sequence. In step S260, data stored in a target memory group is copied to the refresh memory 423. In step S270, there is executed an erase operation on the target memory group. In step S280, data stored in the refresh memory 426 is copied-back to the memory cell array 431. In step S290, data stored in the refresh register 422 is updated.

An operation of a memory system 400 in FIG. 22 described in steps S240 to S290 is similar to those described in FIG. 2, and detailed description thereof is thus omitted.

As described in FIGS. 22 and 23, a memory system according to embodiments of the inventive concept can execute a refresh operation every refresh period. For this, the memory system according to embodiments of the inventive concept includes a time control unit 425 having a time register 426.

In FIGS. 22 and 23, there is shown the case that one non-volatile memory device is connected with a memory controller. But, the inventive concept is not limited to this disclosure. For example, as shown in FIG. 8, the inventive concept described in FIGS. 22 and 23 may be applied to the case that two non-volatile memory devices are connected with a memory controller. In another embodiment, as described in FIG. 15, the inventive concept described in FIGS. 22 and 23 may be applied to the case that N non-volatile memory devices (N being an integer greater than 1) are connected with a memory controller.

Of note, the information stored in the refresh and time registers must be maintained in the absence of memory system power, and during all possible memory system power conditions. For example, the information stored in the refresh and time registers must be maintained even during a sudden power-off (SPO) condition. For this, a memory system according to embodiments of the inventive concept may be implemented to back up information stored in the refresh and time registers in a non-volatile memory. This will be more fully described with reference to FIG. 24.

Figure 24:
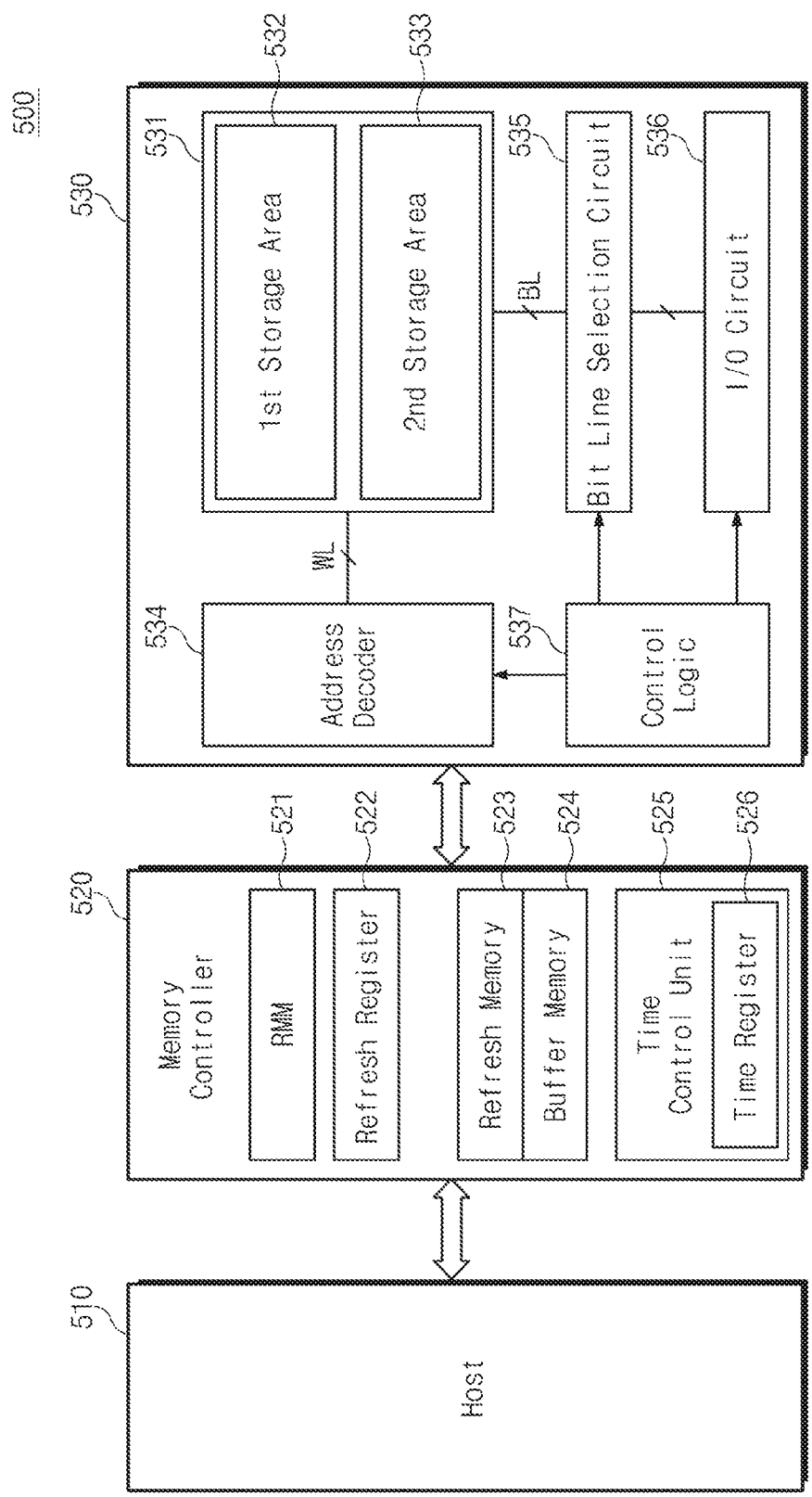
FIG. 24 is a block diagram illustrating a memory system according to still another embodiment of the inventive concept.

FIG. 24 is a block diagram illustrating a memory system according to still another embodiment of the inventive concept.

Referring to FIG. 24, a memory system 500 is connected to a host 510 and comprises a memory controller 520 and a non-volatile memory device 530. The memory system 500 in FIG. 24 is similar to that in FIG. 22.

The host 510 is connected with the memory controller 520. The host 510 receives data via the memory controller 520 and sends data to the memory controller 520. The host 510 is similar to that in FIG. 22, and description thereof is thus omitted.

The memory controller 520 is connected with the host 510 and the non-volatile memory device 530. The memory controller 520 includes a refresh manage module (RMM) 521, a refresh register 522, a refresh memory 523, a buffer memory 524, and a time control unit 525. The memory controller 520 is similar to that in FIG. 22, and description thereof is thus omitted.

The non-volatile memory device 530 is connected with the memory controller 520. The non-volatile memory device 530 includes a memory cell array 531 which is divided into a first storage area 532 and a second storage area 533.

Write data requested by the host 510 may be stored in the first storage area 532. For example, upon a write request from the host 510, data sent from the host 510 may be programmed in the first storage area 532.

Information stored in the refresh and time registers 522 and 526 may be stored (backed-up) in the second storage area 533. For example, address information for the memory groups and memory blocks of each memory group stored in the refresh register 522 may be programmed in the second storage area 533. Refresh sequence information and address information for the last refreshed memory group stored in the refresh register 522 may also be programmed in the second storage area 533. Refresh period and last refresh operation time information stored in the time register 526 may also be programmed in the second storage area 533. In an exemplary embodiment, information stored in the registers 522 and 526 may be programmed periodically in the second storage area 533. In another embodiment, information stored in the registers 522 and 526 may be programmed in the second storage area 533 during idle time in the memory system 500.

As shown in FIG. 24, the non-volatile memory device 530 further includes an address decoder 534, a bit line selection circuit 535, an input/output (I/O) circuit 536, and control logic 537. The elements 534 to 537 are similar to those in FIG. 22, and description thereof is thus omitted.

As described above, the memory system according to embodiments may be implemented to back up critical information stored in refresh and time registers to a non-volatile memory device. Accordingly, it is possible to maintain information of the refresh and time registers regardless of memory system power conditions.

In FIG. 24, there is shown the case that one non-volatile memory device is connected with a memory controller. But, the inventive concept is not limited to this disclosure. For example, as shown in FIG. 8, the inventive concept described in FIG. 24 may be applied to the case that two non-volatile memory devices are connected with a memory controller. In another embodiment, as described in FIG. 15, the inventive concept described in FIG. 24 may be applied to the case that N non-volatile memory devices (N being an integer greater than 1) are connected with a memory controller.

FIGS. 2 to 24 have been described under an assumption of two-dimensional memory cell array structures and architecture. But, the inventive concept is not limited to only two-dimensional memory cell array structure/architecture. Certain embodiments of the inventive concept contemplate the use and incorporation of three-dimensional memory cell arrays. This type of embodiment will be more fully described with reference to FIG. 25.

Figure 25:
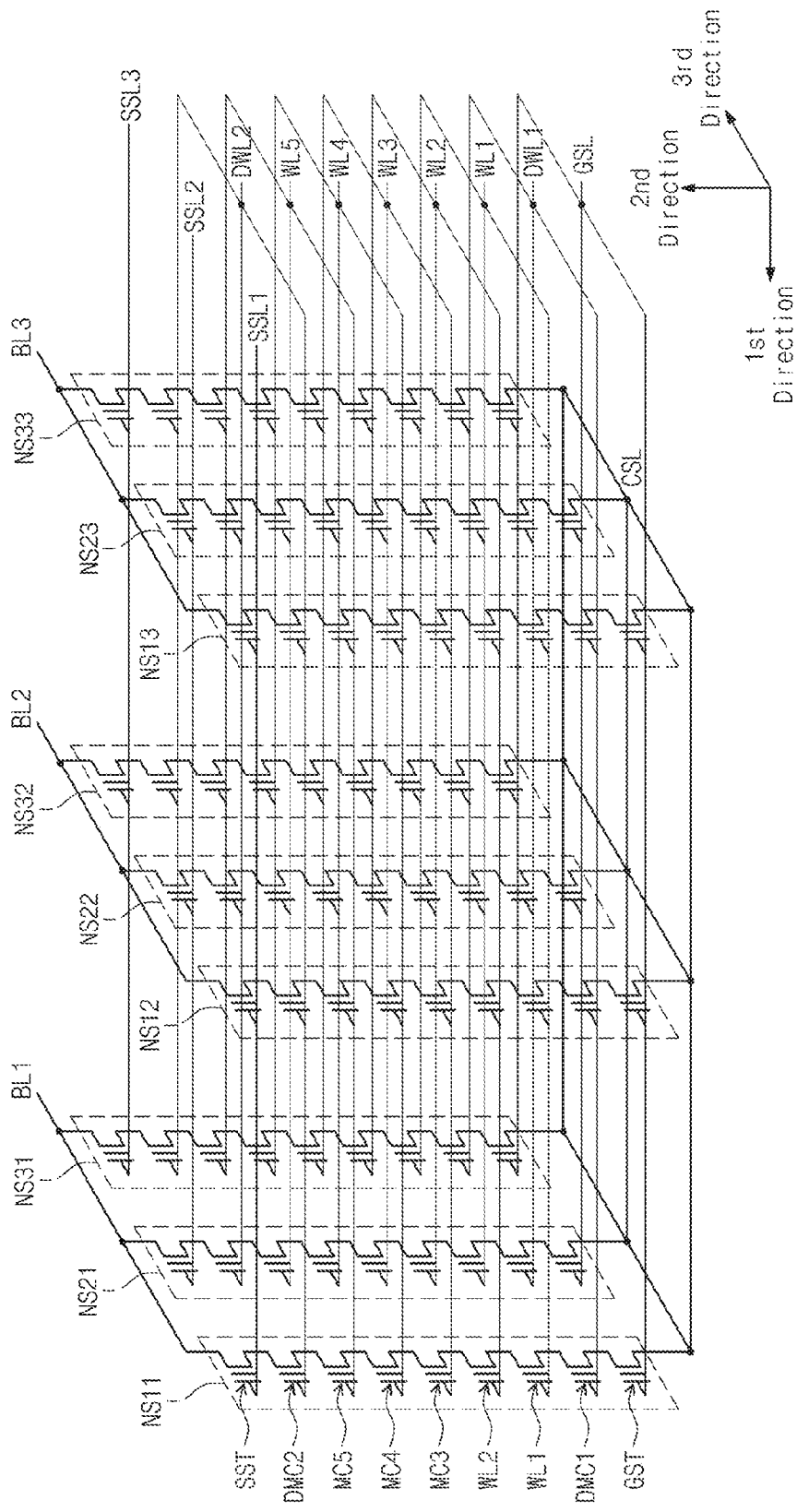
FIG. 25 is a circuit diagram illustrating a three-dimensional memory cell array according to yet another embodiment of the inventive concept.

FIG. 25 is a circuit diagram showing a three-dimensional memory cell array according to an exemplary embodiment of the inventive concept.

Referring to FIG. 25, NAND strings NS11 to NS31 are connected between a bit line BL1 and a common source line CSL. Likewise, NAND strings NS12 to NS32 are connected between a bit line BL2 and the common source line CSL, and NAND strings NS13 to NS33 are connected between a bit line BL3 and the common source line CSL. The bit lines BL1 to BL3 are extended in the third direction and are disposed in parallel along the first direction. Each NAND string NS may include a string select transistor SST, memory cells MC, dummy memory cells DMC, and a ground select transistor GST.

Gates of memory cells on the same layer are electrically connected to a word line which is extended in the first direction. Further, gates of dummy memory cells on the same layer are electrically connected to a dummy word line which is extended in the first direction.

As set forth above, a memory cell array according to embodiments of the inventive concept can be formed of a three-dimensional memory cell array. Memory cells of the three-dimensional memory cell array are arranged in memory groups, which are refreshed according to a given sequence. Grouping of memory cells may be made identically to that described in FIGS. 2 to 24, and description thereof is thus omitted.

Figure 26:
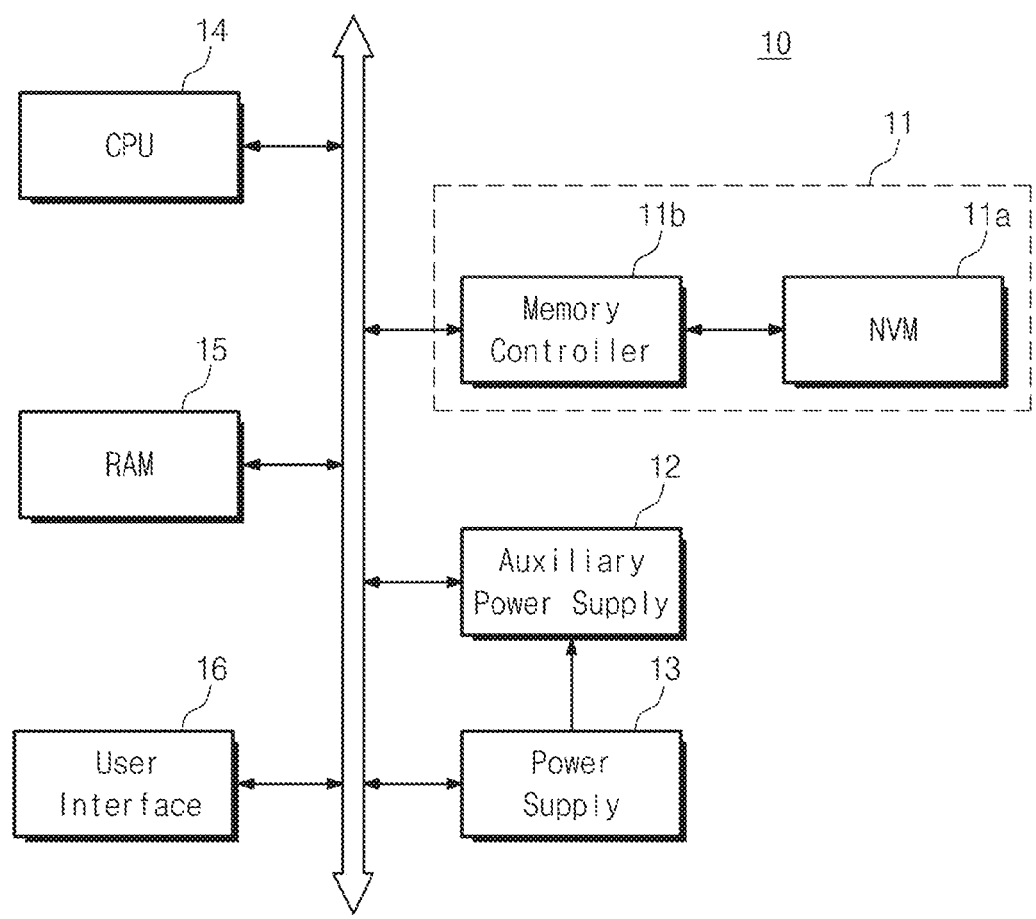
FIG. 26 is a general block diagram of an electronic device incorporating a memory system according to an embodiment of the inventive concept.

FIG. 26 is a block diagram showing an electronic device including a memory system according to an exemplary embodiment of the inventive concept.

An electronic device 10 may be any one of a personal computer, a notebook computer, a cellular phone, a PDA, a camera, and the like. As illustrated in FIG. 26, the electronic device 10 includes a memory system 11, a power supply 13, an auxiliary power supply 12, a CPU 14, a RAM 15, and a user interface 16. The memory system 11 includes a non-volatile memory device 11a and a memory controller 11b.

The memory system 11 in FIG. 26 may be any one of memory systems which are described in FIGS. 2 to 24. The memory system 11 may be implemented to sequentially refresh memory groups, so that the integrity of stored data can be guaranteed.

The above-disclosed subject matter is to be considered illustrative, and not restrictive, and the appended claims are intended to cover all such modifications, enhancements, and other embodiments. Thus, to the maximum extent allowed by law, the scope is to be determined by the broadest permissible interpretation of the following claims and their equivalents, and shall not be restricted or limited to only the foregoing detailed description.

What is claimed is:

1. A operation method of a memory system including three-dimensional memory cell array, the three-dimensional memory cell array comprising a plurality of memory cells arranged in a plurality of memory cell layers, each of the plurality of memory cell arrays is corresponding to a different word line, the method comprising:
grouping the plurality of memory cell layers into a plurality of memory groups;
erasing data of a target memory group selected from the plurality of memory groups; and
storing data corresponding to the target memory group into the non-volatile memory device,
wherein erasing data of the target memory group is triggered off based on a data retention critical time for the plurality of memory groups.

2. The operation method of claim 1, further comprising:
comparing a difference between a last erase operation time and a current time with a predetermined time, and erasing data of the target memory group when the difference exceeds the predetermined time.

3. The operation method of claim 1, wherein each of the plurality of memory groups is corresponding to each of the plurality of memory cell layers.

4. The operation method of claim 1, wherein one of the plurality of memory groups comprises at least two memory cell layers selected from the plurality of memory cell layers.

5. The operation method of claim 1, further comprising:
selecting the target memory group from the plurality of memory groups; and
storing data copied from the target memory group in a register before erasing data of the target memory group,
wherein the data stored in the register is re-stored in the three-dimensional memory cell array.

6. The operation method of claim 5, wherein the data stored in the register is re-stored to memory cell layer of the target memory group.

7. The operation method of claim 5, wherein the data stored in the register is re-stored to memory cell layer different from memory cell layer of the target memory group.

8. A non-volatile memory device comprising:
a three-dimensional memory cell array comprising a plurality of memory cells arranged in a plurality of memory cell layers, and each of the plurality of memory cell layers is corresponding to a different word line; and
control logic controlling the three-dimensional memory cell array,
wherein the control logic is configured to group the plurality of memory cell layers into a plurality of memory groups, erase data of a target memory group selected from the plurality of memory groups, and then store data corresponding to the target memory group into the non-volatile memory device,
wherein the control logic is further configured to trigger off erase operation of the target memory group based on a time information.

9. The non-volatile memory device of claim 8, wherein the control logic generates an interrupt signal initiating the erase operation for the target memory group in accordance with a data retention critical time for the plurality of memory groups.

10. The non-volatile memory device of claim 8, wherein the control logic generates an interrupt signal initiating erase operation for the target memory group when a difference between a last erase operation time and a current time exceeds a predetermined time.

11. The non-volatile memory device of claim 8, wherein each of the plurality of memory groups is corresponding to each of the plurality of memory cell layers.

12. The non-volatile memory device of claim 8, wherein one of the plurality of memory groups comprises at least two memory cell layers selected from the plurality of memory cell layers.

13. The non-volatile memory device of claim 8, wherein the control logic is configured to store data copied from the target memory group to a register, erase data of the target memory group, and then store the data stored in the refresh register into the three dimensional memory cell array.

* * * * *